United States Patent
Lell et al.

(10) Patent No.: US 10,181,695 B2
(45) Date of Patent: Jan. 15, 2019

(54) LASER DIODE

(71) Applicant: OSRAM Opto Semiconductors GmbH, Regensburg (DE)

(72) Inventors: Alfred Lell, Maxhütte-Haidhof (DE); Harald Koenig, Bernhardswald (DE); Adrian Stefan Avramescu, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/560,068

(22) PCT Filed: Mar. 18, 2016

(86) PCT No.: PCT/EP2016/055928
§ 371 (c)(1),
(2) Date: Sep. 20, 2017

(87) PCT Pub. No.: WO2016/150838
PCT Pub. Date: Sep. 29, 2016

(65) Prior Publication Data
US 2018/0083415 A1    Mar. 22, 2018

(30) Foreign Application Priority Data
Mar. 20, 2015  (DE) .......... 10 2015 104 206

(51) Int. Cl.
*H01S 5/026*  (2006.01)
*H01S 5/20*   (2006.01)
(Continued)

(52) U.S. Cl.
CPC ........... *H01S 5/026* (2013.01); *H01S 5/0217* (2013.01); *H01S 5/2009* (2013.01); *H01S 5/22* (2013.01);
(Continued)

(58) Field of Classification Search
CPC .................. H01S 5/32; H01S 5/0217
See application file for complete search history.

(56) References Cited

U.S. PATENT DOCUMENTS 4,380,861 A * 4/1983 Sugino ................ H01S 5/2238
                                                          438/41
4,757,509 A * 7/1988 Isshiki ..................... H01S 5/16
                                                          372/45.01
(Continued)

FOREIGN PATENT DOCUMENTS

JP  60-261184 A  12/1985
JP  2001-185812 A  7/2001

OTHER PUBLICATIONS

T.Y. Wang, "Lateral p-n junctions in metal-organic vapor-phase epitaxy of AlGaAs lasers on GaAs substrates having [011] etched ridges", Appl. Phys. Letters, 1994, vol. 64, p. 1368, (Abstract only).*

(Continued)

*Primary Examiner* — Tuan Nguyen
(74) *Attorney, Agent, or Firm* — DLA Piper LLP (US)

(57) ABSTRACT

A laser diode has a layer arrangement including a first layer structure extending along a Z axis in a longitudinal direction, along an X axis in a transverse direction and along a Y axis in a height direction, and a second and third layer structure arranged along the Z axis on opposite longitudinal sides of the first layer structure and adjoining the first layer structure, wherein the active zone of the first layer structure is arranged offset in height relative to the active zones of the second and third layer structures, and an intermediate layer is arranged laterally with respect to the first layer structure in the second and third layer structures, the intermediate layer configured as an electrically blocking layer that hinders or prevents a current flow, and the intermediate layer being arranged between the active zone and an n contact.

17 Claims, 21 Drawing Sheets

(51) Int. Cl.
*H01S 5/02* (2006.01)
*H01S 5/22* (2006.01)
*H01S 5/223* (2006.01)
*H01S 5/32* (2006.01)

(52) U.S. Cl.
CPC .......... *H01S 5/2235* (2013.01); *H01S 5/2237* (2013.01); *H01S 5/32* (2013.01); *H01S 5/2222* (2013.01); *H01S 5/2234* (2013.01); *H01S 5/3211* (2013.01)

(56) References Cited

U.S. PATENT DOCUMENTS

| | | | |
|---|---|---|---|
| 5,400,356 A | | 3/1995 | Bringans et al. |
| 5,436,194 A | * | 7/1995 | Kondo .................. G11B 7/126 148/DIG. 95 |
| 5,465,266 A | | 11/1995 | Bour et al. |
| 5,581,116 A | * | 12/1996 | Nakatsu ................ C23C 16/047 257/103 |
| 5,732,099 A | * | 3/1998 | Kawasumi ............. B82Y 20/00 257/103 |
| 6,420,198 B1 | * | 7/2002 | Kimura ................. H01L 33/145 257/E33.067 |

OTHER PUBLICATIONS

T. Y. Wang, "Lateral p-n junctions in metal-organic vapor-phase epitaxy of AlGaAs lasers on GaAs substrates having [011] etched ridges", *Applied Physics Letters*, 1994, vol. 64, No. 11, p. 1368, Abstract only.

* cited by examiner

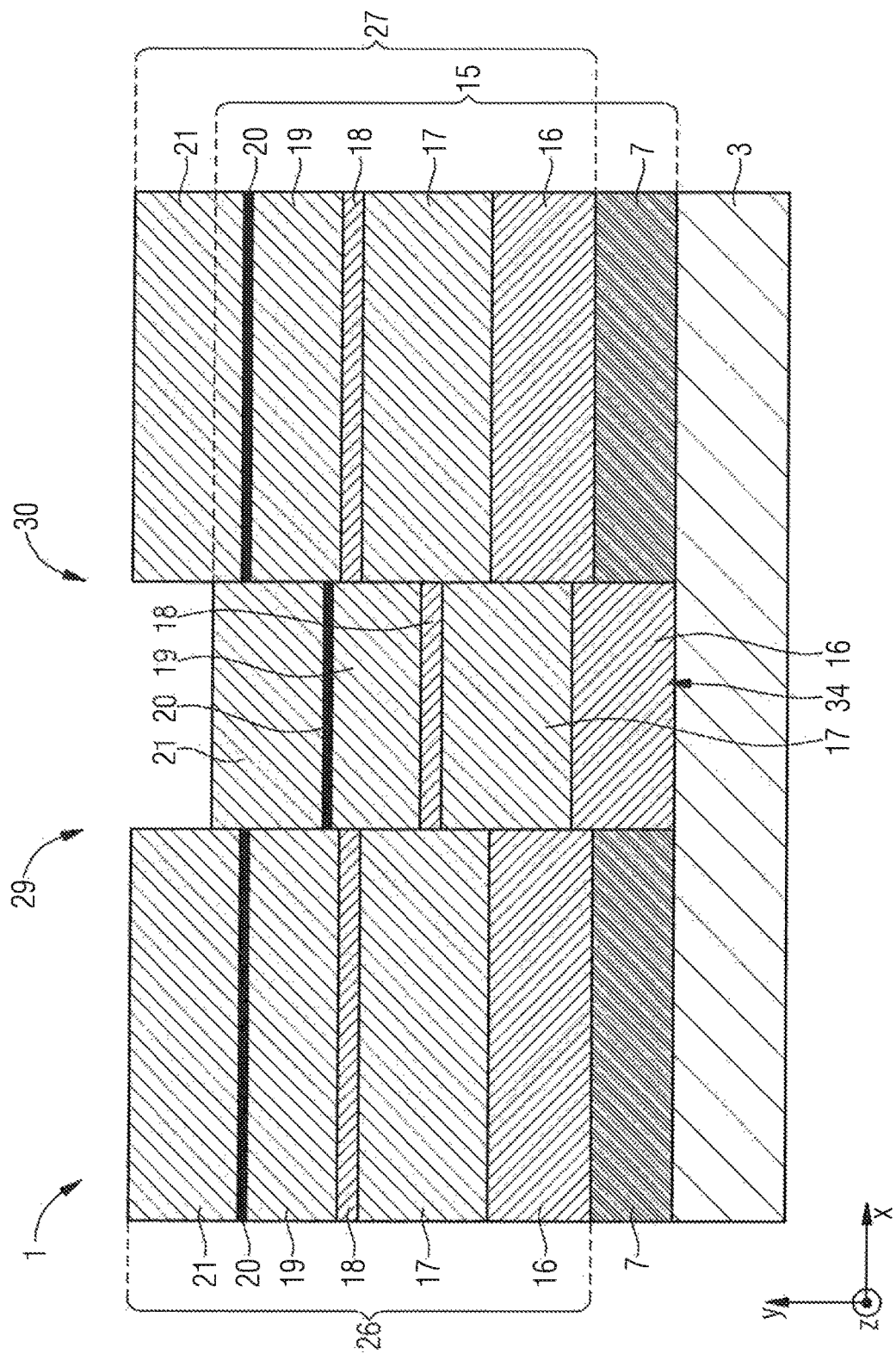

LASER DIODE

TECHNICAL FIELD

This disclosure relates to a laser diode and a method of producing a laser diode.

BACKGROUND

Laser diodes having a rigid structure and a laser mode guided laterally by an index discontinuity are known.

There is a need to provide an improved laser diode having lateral index guiding and an improved method of producing a laser diode having lateral index guiding.

SUMMARY

We provide a laser diode having a layer arrangement with layers arranged on one another, the layer arrangement including a first, a second and a third layer structure with at least one active zone and two waveguide layers, the active zone being arranged between the two waveguide layers, and having a first layer structure, the first layer structure extending along a Z axis in a longitudinal direction, along an X axis in a transverse direction and along a Y axis in a height direction, and a second and a third layer structure arranged along the Z axis on opposite longitudinal sides of the first layer structure and adjoining the first layer structure, wherein the active zone of the first layer structure is arranged offset in height relative to the active zones of the second and third layer structures, and the active zone is arranged between a p contact and an n contact, an intermediate layer being arranged laterally with respect to the first layer structure in the second and third layer structures, the intermediate layer configured as an electrically blocking layer that hinders or prevents a current flow, and the intermediate layer being arranged between the active zone and the n contact.

We also provide a method of producing the laser diode, wherein a layer arrangement having a first, a second and a third layer structure with layers arranged on one another is produced, the layer arrangement including at least one active zone and two waveguide layers, the active zone being arranged between the two waveguide layers, the layer arrangement being produced such that a first layer structure is formed along a Z axis in a longitudinal direction, along an X axis in a transverse direction and along a Y axis in a height direction, a second and a third layer structure being formed along the Z axis on opposite longitudinal sides of the first layer structure and adjoining the first layer structure, and the active zone of the first layer structure being arranged offset in height relative to the active zones of the second and third layer structures by a recess being introduced into a carrier or a web being formed out of a carrier, and the layers of the layer arrangement being deposited on the carrier, the active zone being arranged between a p contact and an n contact, an intermediate layer being formed laterally with respect to the first layer structure in the second and third layer structures, the intermediate layer being configured as an electrically blocking layer that hinders or prevents a current flow, and the intermediate layer being arranged between the active zone and the n contact.

We further provide a method of producing the laser diode, wherein a carrier with a web is provided, wherein intermediate layers are formed laterally beside the web and adjacent to the web on a first and a second side face of the carrier, wherein then a layer arrangement having a first, a second and a third layer structure with the layers being arranged on one another is produced on the web and on the intermediate layers, wherein the layer arrangement includes at least one active zone and two waveguide layers, wherein the active zone is arranged between the two waveguide layers, wherein the layer arrangement is produced by an epitaxial growth method such that the layers of the first, the second and the third layer structure are applied layerwise and simultaneously for the first, the second and the third layer structure, wherein the first layer structure is formed on the web along a Z axis in a longitudinal direction, along an X axis in a transverse direction and along a Y axis in a height direction, wherein the second layer structure and the third layer structure are formed beside the web on the intermediate layers along the Z axis on opposite longitudinal sides of the first layer structure and adjoining the first layer structure, wherein the active zone of the first layer structure is arranged offset in height relative to the active zones of the second and the third layer structure, wherein the active zone is arranged between a p contact and an n contact, wherein the intermediate layer is configured as an electrically blocking layer that hinders or prevents a current flow, wherein the intermediate layer is arranged between the active zone and the n contact.

BRIEF DESCRIPTION OF THE DRAWINGS

FIG. 2 shows a cross section through an excerpt of a laser diode having an abrupt shoulder with a blocking layer.

Figure 1A:
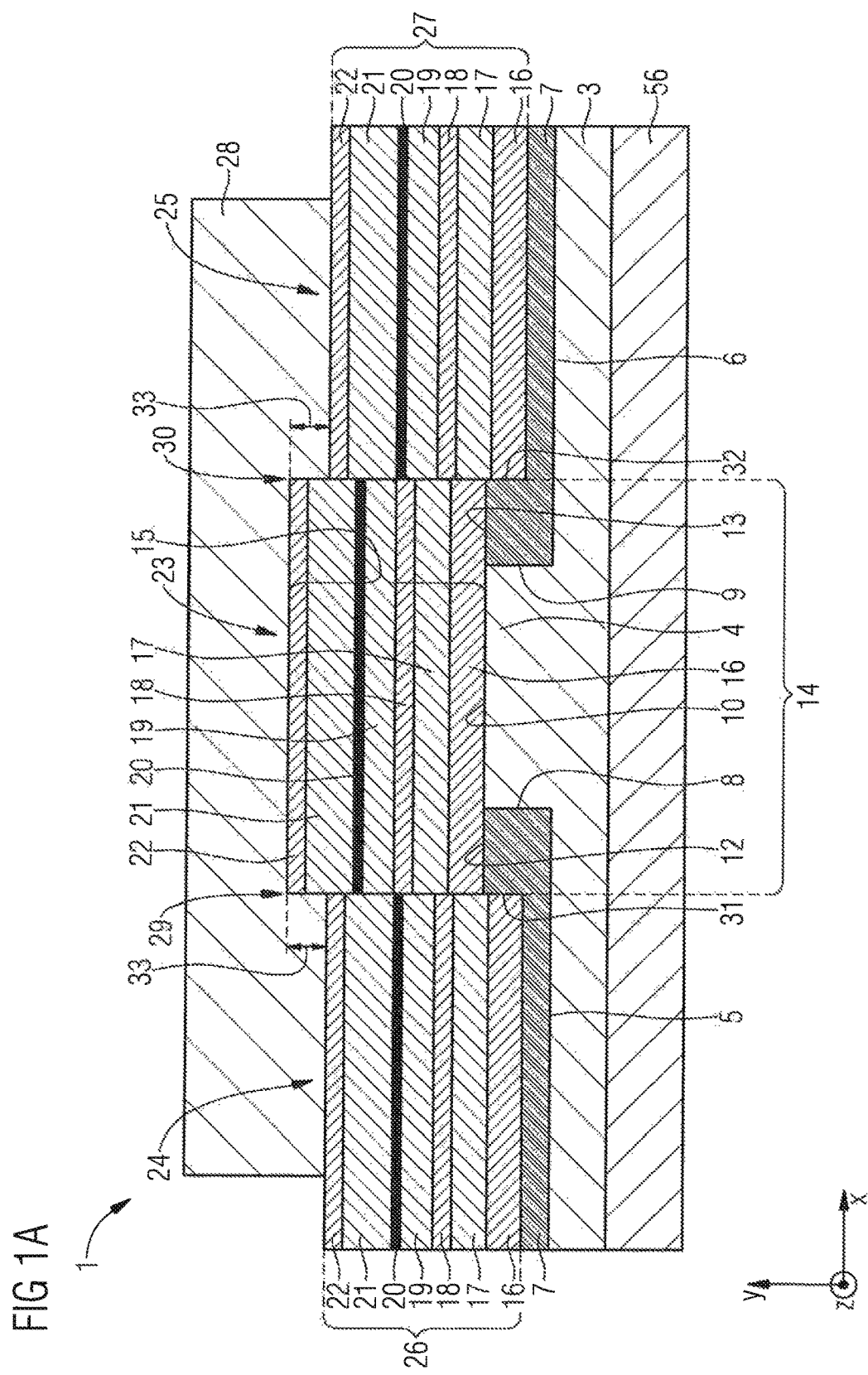
FIG. 1A shows a cross section through a first example of a laser diode.

LIST OF REFERENCES 1 laser diode
3 substrate
4 web
5 first side face
6 second side face
7 intermediate layer
8 first lateral face
9 second lateral face
10 surface
12 second surface
13 third surface
14 strip-like surface
15 first layer structure
16 first cover layer
17 n-waveguide layer
18 active zone
19 p-waveguide layer
20 blocking layer
21 second cover layer
22 contact layer
23 ridge structure
24 first side region
25 second side region
26 second layer structure
27 third layer structure
28 p-metallization
29 first intermediate region
30 second intermediate region
31 first side face
32 second side face
33 height difference
34 first recess
35 second recess
36 first inner face
37 second inner face
38 third inner face
39 fourth inner face
40 etching mask
41 etching opening
42 first mirror face
43 second mirror face
44 photomask
45 etching mask opening
46 first further etching opening
47 second further etching opening
48 first further recess
49 second further recess
50 insulation layer
51 contact
52 photoresist layer
53 second insulation layer
54 current path
55 spacer layer
56 n-metallization

DETAILED DESCRIPTION

One advantage of our laser diode is that the lifetime of the laser diode is improved. This is achieved by the active zone not being structured by an etching method for lateral index guiding. In this way, possible damage to the active zone by the etching method is avoided. Furthermore, the laser diode has an improved voltage supply since a large-area contact connection is possible.

Furthermore, the laser diode can be produced with the aid of a simple production method since lateral index guiding of the laser mode is achieved without etching of a ridge structure being necessary. In addition, an elaborate passivation opening can be omitted from the proposed laser diode even in a narrow first layer structure.

Our laser diode respectively has an active zone in the region of the first layer structure and in the two laterally adjoining further layer structures, the active zones of the first layer structure being offset in height relative to at least one active zone of the further layer structures.

In this way, a laser diode is provided in which the lateral index guiding is achieved by the height offset between the active zone of the layer structures.

The active zones of the laterally arranged further layer structures may be arranged at the same height. In this way, uniform lateral guiding of the laser mode is achieved. The active zone may be arranged between an n contact and a p contact. The intermediate layer may be arranged laterally with respect to the first layer structure and between the active zone and the n contact. In this case, the intermediate layer may be arranged in the first layer structure and in the second layer structure. A current flow in the first side region and in the second side region is thereby hindered, in particular prevented. In this way, a concentration of the current flow is brought about by the active zone of the first layer structure.

The intermediate layer is, in particular, arranged between the active zone and an n-doped layer, particularly in the region of the n-doped layers. Because of the higher conductivity of the n-doped semiconductor layers, a current constriction by the intermediate layer in the region of the n-doped layers leads to a smaller drop of the component voltage of the laser diode.

The intermediate layer may, in particular, be formed as an epitaxially deposited layer. Furthermore, the intermediate layer may comprise doping produced with the aid of a dopant during epitaxial deposition.

The active zone of the first layer structure may be arranged offset in height by at least the thickness of the active zone of the layer structure relative to the active zones of the further layer structures. In this way, a further improvement of the lateral index guiding of the laser mode is achieved.

The first layer structure may be arranged at least partially in a recess of a carrier. With this arrangement as well, lateral guiding of the laser modes is achieved because of a change in the refractive index.

The first layer structure, the second layer structure and the third layer structure respectively may comprise the active zone and two waveguide layers, the active zone being arranged between the two waveguide layers. In this way, improved guiding of the laser modes is achieved.

The first layer structure, the second layer structure and the third layer structure respectively may comprise the active zone, the waveguide layers and a first and a second cover layer, which respectively adjoin the first and the second waveguide layer. In this way, a further improvement of the lateral mode guiding is achieved.

The electrical p contact may have a wider extent in the X direction than the electrically conductive web by which the first layer structure electrically conductively connects to the n contact. In this way, it is possible to compensate for a lower conductivity of the p contact, and a concentration of the current flow in the active zone is nevertheless achieved.

The p contact may have a smaller extent in width, i.e. in the X direction, than the first layer structure. For example, the p contact is arranged centrally with respect to the width of the first layer structure. A further concentration of the current flow onto a central region in relation to the width of the first layer structure is therefore achieved.

The second layer structure and the third layer structure respectively may have a second and a third intermediate layer, the intermediate layers being configured to at least reduce or prevent the current flow. In this way as well, concentration of the current flow in the region of the first layer structure is reinforced. The second intermediate layer and the third intermediate layer may be arranged at the same height.

The first layer structure may comprise a first intermediate layer, the intermediate layer being configured to at least reduce or prevent the current flow. The first intermediate layer of the first layer structure may be arranged offset in height relative to the second intermediate layer of the second layer structure and relative to the third intermediate layer of the third layer structure. In this way as well, concentration of the current flow in the region of the first layer structure is reinforced.

The second and third layer structures may connect respectively via an intermediate region to the first layer structure. The layers of the intermediate region may be arranged inclined at an angle of 5° to 90° with respect to the plane of the active zone of the first layer structure, i.e. relative to the Z-Y plane. The layers of the intermediate region are arranged parallel to one another.

The above-described properties, features and advantages, as well as the way in which they are achieved, will become more clearly and readily comprehensible in conjunction with the following description of the examples, which will be explained in more detail in connection with the drawings.

FIG. 1A shows a schematic representation of a cross section through a first example of a laser diode 1. The laser diode 1 comprises an n-metallization 56, on which an electrically conductive substrate 3 is arranged. The substrate 3 constitutes a carrier. Instead of the substrate 3, it is also possible to provide any other type of electrically conductive material, in particular semiconductor material, which forms a carrier. The substrate 3 comprises a web 4 protruding upward in height along a Y axis beyond side regions 5, 6 of the substrate 3 and extending lengthwise along a Z axis. Furthermore, the web 4 has a fixed width along an X axis. The Z axis, the Y axis and the X axis are respectively perpendicular to one another. The first and second side faces 5, 6 constituting an upper side of the substrate 3 laterally with respect to the web 4, are covered with an intermediate layer 7. The web 4 is therefore widened by the intermediate layers 7 arranged on both sides, which are slightly electrically conductive or not electrically conductive. Furthermore, a first and a second lateral face 8, 9 of the web 4, arranged perpendicularly to the X-Z plane, are covered with the intermediate layer 7. A surface 10 of the web 4, arranged parallel to the X-Z plane, and further surfaces 12, 13 of the intermediate layer 7, arranged adjacent to the surface 10 and parallel to the X-Z plane, form a strip-like surface 14. Of the strip-like surface 14, only the region which is narrower in the X direction of the surface 10 formed by the web 4 is electrically conductive. A first layer structure 15 having a plurality of layers is arranged on the strip-like surface 14. The first layer structure 15 comprises a negatively doped first cover layer 16 arranged on the strip-like surface 14. A negatively doped waveguide 17 is arranged on the first cover layer 16. An active zone 18 is arranged on the negatively doped waveguide 17. A positively doped waveguide 19 is arranged on the active zone 18. A blocking layer 20 for electrons is arranged on the positively doped waveguide 19. A positively doped second cover layer 21 is arranged on the blocking layer 20. A contact layer 22 is arranged on the second cover layer 21. Depending on the example selected, the blocking layer 20 may also be arranged in the positively doped waveguide 19.

The first layer structure 15 defines a ridge structure 23. Next to the ridge structure 23, a first side region 24 and a second side region 25 are provided. A second layer structure 26 is arranged in the first side region 24. The second layer structure 24 comprises a negatively doped first cover layer 16 arranged on a surface of the intermediate layer 7. A negatively doped waveguide 17 is arranged on the first cover layer 16. An active zone 18 is arranged on the negatively doped waveguide 17. A positively doped waveguide 19 is arranged on the active zone 18. A blocking layer 20 for electrons is arranged on the positively doped waveguide 19. A positively doped second cover layer 21 is arranged on the blocking layer 20. A contact layer 22 is arranged on the second cover layer 21. The contact layer 22 may constitute a p-contact layer. The second layer structure 26 adjoins the first layer structure 15 with a side region. The second layer structure 26 has the same construction as the first layer structure 15, but is arranged deeper in height in relation to the substrate 3 than the first layer structure 15.

A third layer structure 27 is provided in the second side region 25. The third layer structure 27 comprises a negatively doped first cover layer 16 arranged on a surface of the intermediate layer 7. A negatively doped waveguide 17 is arranged on the first cover layer 16. An active zone 18 is arranged on the negatively doped waveguide 17. A positively doped waveguide 19 is arranged on the active zone 18. A blocking layer 20 for electrons is arranged on the positively doped waveguide 19. A positively doped second cover layer 21 is arranged on the blocking layer 20. The blocking layer 20 may also be arranged in the p-doped waveguide 19. A contact layer 22 is arranged on the second cover layer 21. The third layer structure 27 is configured according to the first layer structure 15, but is arranged lower in terms of the height position in relation to the substrate 3. The first layer structure 15 is arranged higher by a predetermined height difference 33 relative to the second and third layer structures 26, 27. The second and third layer structures 26, 27 are arranged at the same height.

The first, the second and the third layer structures 15, 26, 27 are covered with a p-metallization 28. The first layer structure 15 merges via a first intermediate region 29 into the second layer structure 26. The first layer structure 15 merges via a second intermediate region 30 into the third layer structure 27. Furthermore, the first layer structure 15 has a height difference 33 relative to the second and third layer structures 26, 27 of 20 nm to 500 nm, preferably 30 nm to 400 nm, preferably 50 nm to 300 nm. In particular, the active zone 18 of the first layer structure 15 is offset in height relative to the active zone 18 of the second layer structure 26 and/or relative to the active zone 18 of the third layer structure 27 20 nm to 500 nm, preferably 30 nm to 400 nm, preferably 50 nm to 300 nm. By virtue of the height difference 33 between the first layer structure 15 and the adjoining second and third layer structures 26, 27, lateral index guiding is achieved. A lower variance of the laser threshold current, a greater steepness and a better kink behavior are thereby achieved.

Furthermore, the individual layers of the three layer structures 15, 26, 27 may either adjoin one another or connect to one another in the form of continuous layers, depending on an inclination angle of the layer structures in the first and second intermediate regions 29, 30. By virtue of the height offset between the active zone 18 of the ridge structure 23 and the active zones 18 of the first and second side regions 24, 25, lateral index guiding of the light radiation generated by the active zone 18 of the first layer structure 15 is achieved. The active zone is therefore arranged between an n-contact and a p-contact, the n-contact and the p-contact being formed by corresponding layers which are electrically conductively connected to the n-metallization and the p-metallization, respectively, and are respectively arranged on the n side and the p side in relation to the active zone.

Figure 1B:
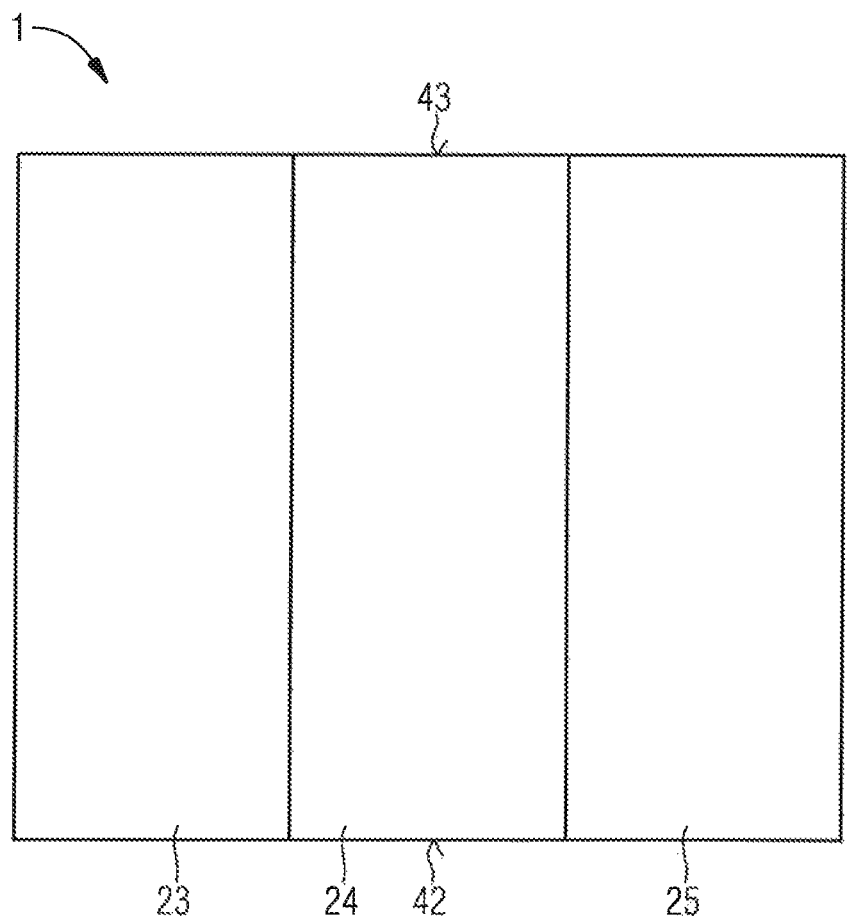
FIG. 1B shows a view from above of the laser diode of FIG. 1A.

FIG. 1B shows a schematic representation of the laser diode 1 from above with a view of the ridge structure 23, the first side region 24 and the second side region 25. In this view, representation of the p-metallization 28 has been omitted. The laser diode may be configured as an edge-emitting laser diode, the laser light generated by the active zone being guided laterally in the ridge structure 13 and reflected at least partially on mutually opposing mirror faces. At edges of the laser diode 1, a first mirror face 42 and a second mirror face 43, at which the laser light is at least partially reflected or extracted, are respectively provided at opposite ends.

Depending on the example selected, the intermediate layer 7 may also be omitted from the laser diode 1. The intermediate layer 7 has a low electrical conductivity, or is configured to be electrically insulating. The intermediate layer 7 is used as an electrical resistance layer or blocking layer, which is intended to reduce and in particular prevent a flow of the electrical current through the side regions 24, 25. If the intermediate layer 7 is omitted, the first layer structure 15 has the same width as the web 4 of the substrate 3. The layers of the first, second and third layer structure 15, 26, 27 are respectively deposited simultaneously. The shape of the layers of the layer structures 15, 26, 27 in the intermediate regions 29, 30 in this case depends on the inclination angles of the side faces 31, 32 of the intermediate layer 7, which bound the strip-like surface 14 on both sides along the Z axis. If formation of the intermediate layer 7 has been omitted entirely or at least in the region of the first and second lateral faces 8, 9 of the web 4, then the construction of the layer structures in the region of the first and second intermediate regions 29, 30 are dictated by the inclination angles of the first and second side faces 8, 9 of the web 4, which laterally bound the web 4 along the Z axis.

The inclination angles of the first and second side faces 8, 9 of the web 4 or of the side faces 31, 32 of the intermediate layer 7 may be arranged to 5° to 90°, preferably 20° to 88°, in particular 40° to 85° in relation to the X-Z plane.

The second intermediate layer 7 in the first and second side regions 23, 24 prevents undefined broadening of the current flow outside the active zone 18 of the first layer structure 15. There is therefore a defined current path in the first layer structure 15 so that charge carrier losses are reduced or minimized. An increase in the quantum efficiency of the active zone 18 is thereby achieved. Due to the large-area contact layer 22, there is a lower operating voltage during operation of the laser diode. Furthermore, due to the strips, on both sides, of the intermediate layer 7, the electrically conductive region of the strip-shaped surface 14 is limited to the region of the web 4. In contrast thereto, the contact layer 22 arranged on the first layer structure 15 has a greater width than the web 4 in the X direction.

FIG. 2 shows an excerpt of a first example of the laser diode 1, in which the layers of the first, second and third layer structures merge in the first and second intermediate regions 29, 30 in the form of an abrupt shoulder with an angle of 90°. Furthermore, in the example represented, the first layer structure 15 is arranged closer to the substrate 3 than the second and third layer structures 26, 27. This is achieved by the intermediate layer 7, which is applied on the substrate 3, having a recess 34. The intermediate layer 7 and the substrate 3 constitute a carrier. The recess 34 has a fixed length along the Z axis, a fixed width along the X axis and a fixed depth along the Y axis. In the example represented, the length of the recess is greater than the width of the recess. Furthermore, the width of the recess is greater than the depth of the recess. The first cover layer 16 of the first layer structure 15 is arranged in the recess 34. The active zone 18 of the first layer structure 15 is bounded laterally by the n-waveguide layers 17 of the second and third layer structures 26, 27. The refractive index of the n-waveguide layers 17 is less than the refractive index of the active zone 18 so that lateral index guiding of the laser mode between the n-waveguide layers 17 of the second and third layer structures 26, 27 in the first layer structure 15 is achieved.

Figure 3:
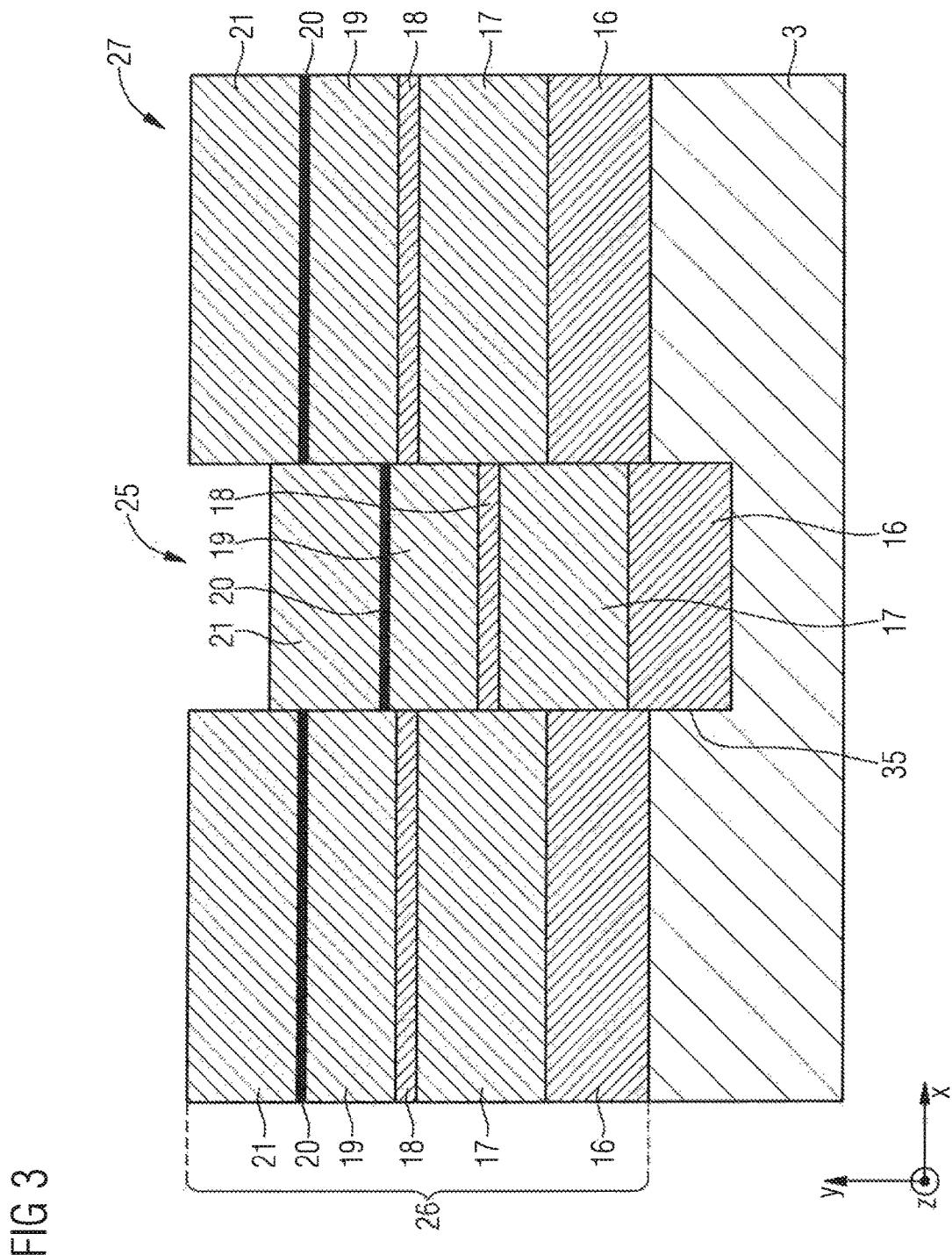
FIG. 3 shows a cross section through a subregion of a laser diode having an abrupt shoulder without a blocking layer.

FIG. 3 shows another example of a laser diode 1, in which the layers of the first, second and third layer structures 15, 26, 27 merge abruptly into one another via the intermediate regions 29, 30 with an angle of 90°. In this example as well, the active zone 18 of the first layer structure 15 is arranged deeper than the active zones 18 of the second or third layer structures 26, 27. In this example, this is achieved by a second recess 35, in which the first layer structure 15 is constructed, being provided in the substrate 3. In this example, the intermediate layer 7 has been omitted. Independently thereof, an intermediate layer 7 may also be arranged between the first cover layer 16 of the second and third layer structures 26, 27 in this example. Depending on the depth of the first recess 34 and the depth of the second recess 35, the active zone 18 of the first layer structure 15 is correspondingly displaced relative to the active zones 18 of the second and third layer structures 26, 27. The active zone 18 of the first layer structure 15 should be displaced at least partially, in particular fully, relative to the active zones 18 of the second or third layer structure 26, 27 to allow lateral index guiding. Full displacement involves arrangement of the active zone 18 of the first layer structure 15 by at least the thickness of the active zone 18.

Figure 4:
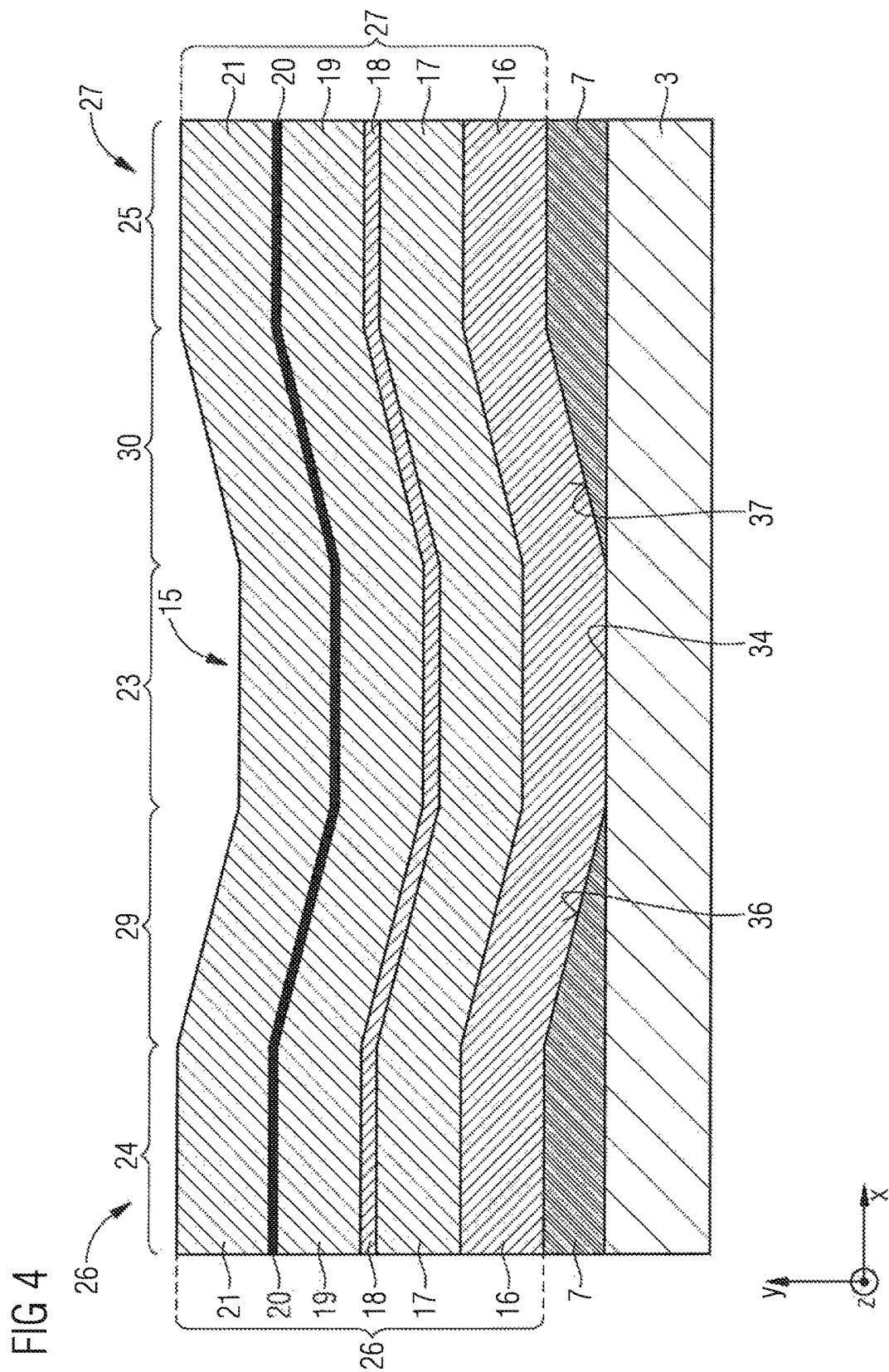
FIG. 4 shows a cross section through a subregion of a laser diode having a blocking layer and having a ramp-like transition between the first layer structure and the adjoining second or third layer structure.

FIG. 4 shows another example of a laser diode, wherein the first intermediate region 29 and the second intermediate region 30 are configured not abruptly but more broadly. This is achieved by the layers of the second layer structure 26 merging via a small angle, for example, 5° in the first intermediate region 29 into the layers of the first layer structure 15. Correspondingly, the layers of the first layer structure 15 likewise merge via a small angle of, for example, 5° in the second intermediate region 30 into the layers of the third layer structure 27. This is achieved, for example, by the blocking layer 7 arranged on the substrate 3, having correspondingly inclinedly arranged inner faces 36, 37, that laterally bound the first recess 34. The substrate 3 and the intermediate layer 7 constitute a carrier. When the layers are deposited, by the inclined arrangement of the inner faces 36, 37 of the intermediate layer 7, corresponding intermediate regions 29, 30 are formed, in which the deposited layers are likewise arranged at a corresponding angle of, for example, 5° relative to the plane of the layers in the region of the ridge structure 23. In this example as well, an index discontinuity is induced in lateral regions of the active zone 18 of the first layer structure 15 adjacent to the intermediate regions 29, 30. Lateral guiding of the laser mode by the index discontinuity in the intermediate regions 29, 30 is thereby achieved.

Figure 5:
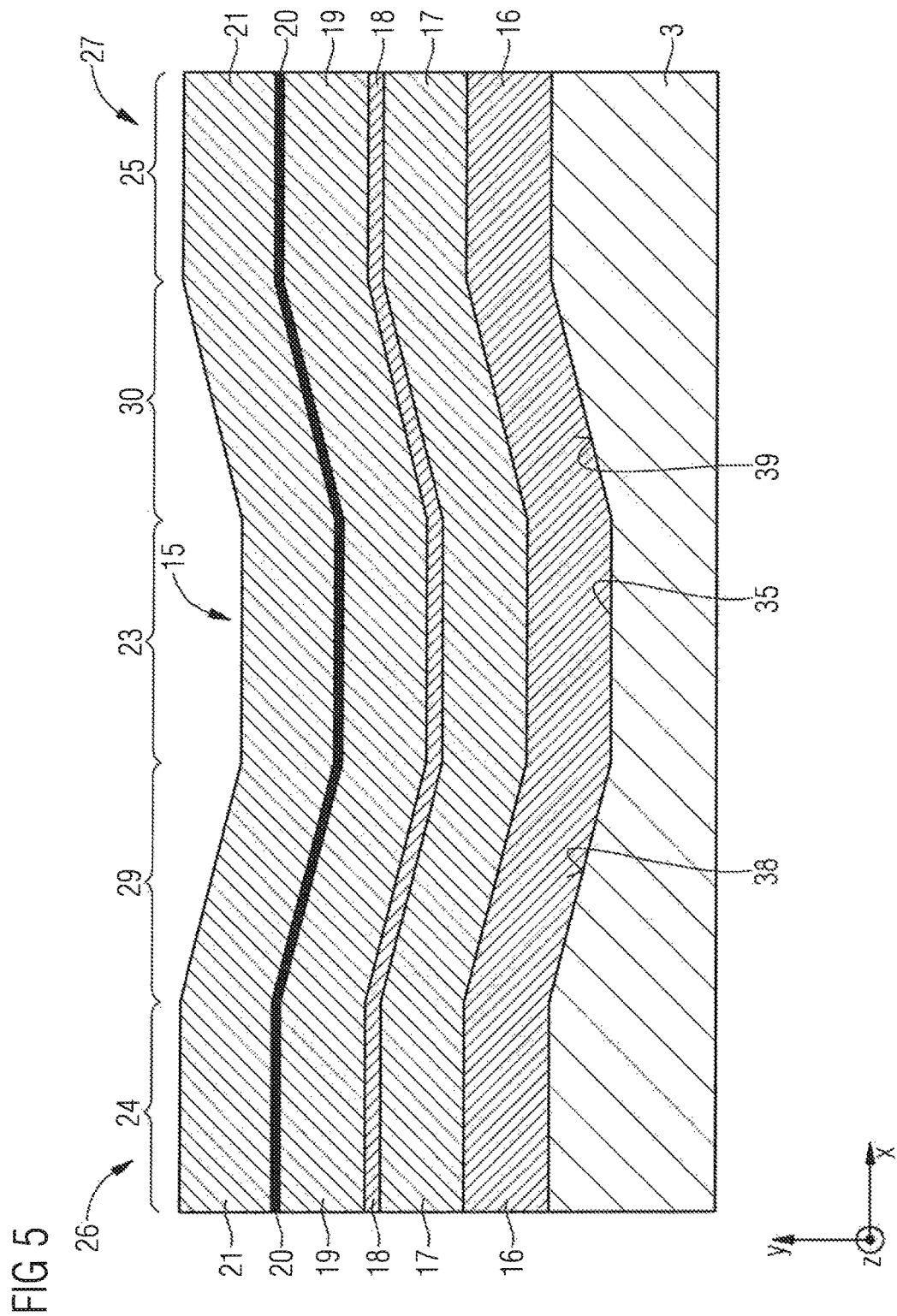
FIG. 5 shows a cross section through a subregion of a laser diode having a ramp-like transition between the first layer structure and the adjoining layer structures.

FIG. 5 shows another example of a laser diode 1, in which the layers of the first, second and third layer structures 15, 26, 27 are arranged according to FIG. 4. However, the intermediate layer 7 is omitted. Instead, the substrate 3 has a second recess 35 in which a third and a fourth inner face 38, 39 of the second recess 35 are arranged at an angle of 5° relative to the X-Z plane. During deposition of the layers of the first, second and third layer structures 15, 26, 27, a first side region 24 having planar layers, a first intermediate region 29 having inclinedly arranged layers, a ridge structure 23 having planar-arranged layers, a second intermediate region 30 having inclinedly arranged layers, and a second side region 25 having planar-arranged layers, are therefore likewise produced. In this example as well, lateral guiding of the laser mode in the active zone 18 of the first layer structure 15 is achieved by the inclinedly arranged active zones 18 of the intermediate regions 29, 30.

Figure 6:
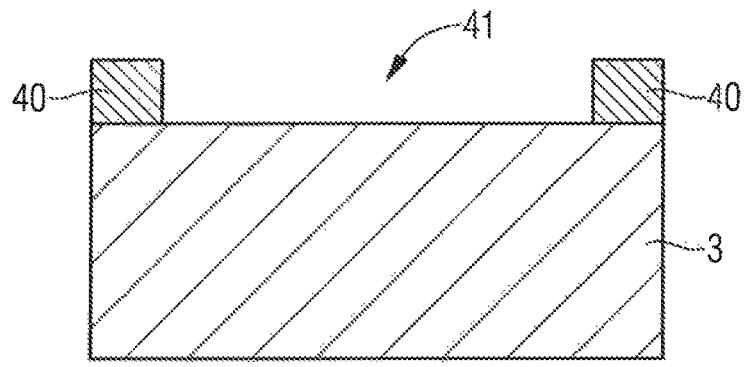
FIGS. 6 to 9 show method steps of producing a laser diode with index guiding by etching of the substrate in the region of the first layer structure.
Figure 7:
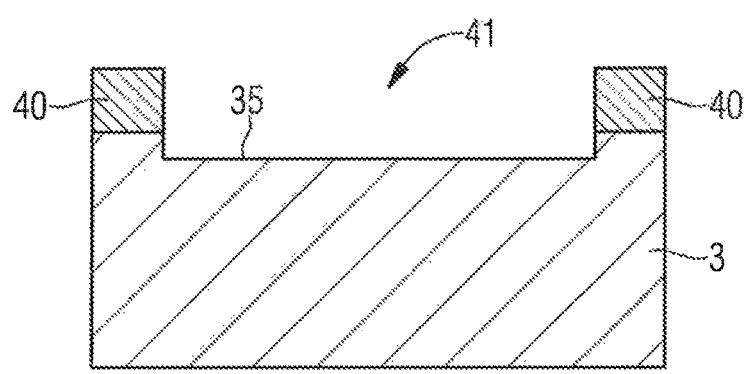
Figure 8:
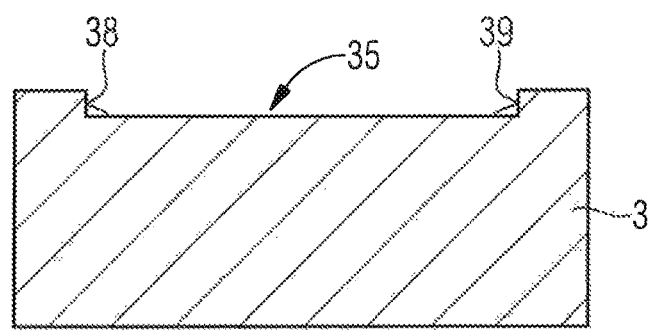

FIGS. 6 to 9 show various method steps of a method of producing a laser diode having index guiding by etching of the substrate 3 in the region of the ridge structure. FIG. 6 shows a cross section through a substrate 3, on which an etching mask 40 is applied. The etching mask 40 may, for example, be formed from photoresist, from a dielectric layer or from metal. The etching mask 40 delimits an etching opening 41. In a subsequent method step, a second recess 35 is introduced into the surface of the substrate 3 through the etching opening 41, as represented in FIG. 7. Various etching methods may be used to introduce the second recess 35. The etching mask 40 is subsequently removed, and a substrate 3 having the second recess 35 is obtained, as represented in FIG. 8. Subsequently, the individual layers of the first, second and third layer structures 15, 26, 27 are deposited successively, but simultaneously for all three layer structures 15, 26, 27. In particular, the layers of the layer structures are applied with the aid of epitaxial growth. Depending on the desired example of the laser diode, corresponding layers are deposited.

Figure 9:
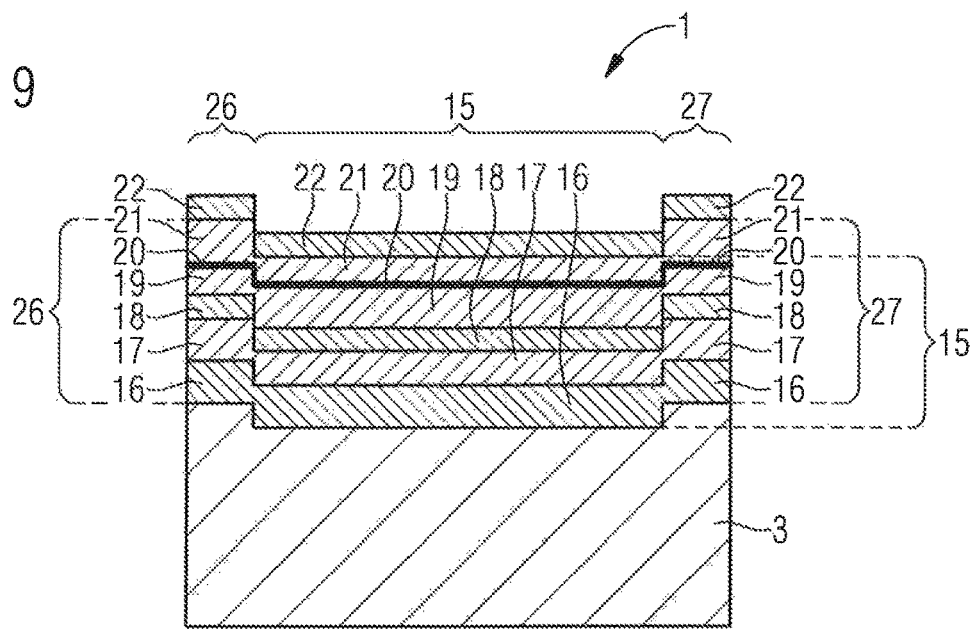

FIG. 9 shows an example of the construction of a laser diode 1, wherein a negatively doped first cover layer 16, an n waveguide layer 17, an active zone 18, a p-waveguide layer 19, a blocking layer 20 for electrons, and a positively doped second cover layer 21 have been deposited as layers for the first, second and third layer structures 15, 26, 27. A contact layer 22 is furthermore deposited on the second cover layer 21.

In the example represented, the second recess 35 has vertically arranged third and fourth inner faces 38, 39. Due to the vertical configuration of the third and fourth inner faces 38, 39 of the second recess 35, an abrupt transition in the first and second intermediate regions 29, 30 between the layers of the second layer structure 26 and of the first layer structure 15, and respectively between those of the first layer structure 15 and of the third layer structure 27, is achieved during the deposition of the layers. The transition of the layers is provided according to the example of FIG. 3. The active zone 18 of the first layer structure 15 is arranged deeper in height at least partially, in particular at least by the thickness of the active zone 18, relative to the active zones 18 of the second or third layer structure 26, 27. In this way, the side regions of the active zone 18 of the first layer structure 1 at least partially adjoin the n-waveguide 17 of the second and third layer structures 26, 27. Lateral index guiding of the laser mode in the first layer structure 15 is thereby achieved.

By the method of FIGS. 6 to 9, lateral wave guiding of the laser mode is achieved by an index change, in particular an index discontinuity, without multistep epitaxy being necessary. In addition, ridge etching can be omitted. Furthermore, it is not necessary to define different materials by an etching step. In this way, undefined etched shoulders can be avoided. In addition, undefined oxidation of epi layers containing aluminum is not necessary. In this way, damage by etching methods can be avoided. A laser diode having an increased long-term stability is therefore provided. In addition, the threshold current for operating the laser diode is reduced. Furthermore, a large-area contact connection in the form of the contact layer 22 is possible despite the ridge structure, or the lateral index guiding. A low operating voltage is therefore sufficient for operating the laser diode.

Figure 10:
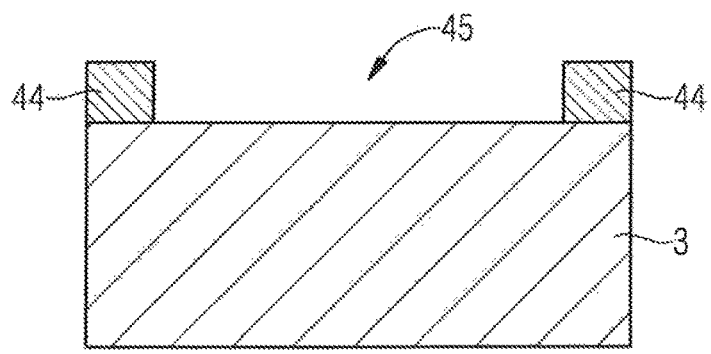
FIGS. 10 to 14 show method steps of producing a laser diode with index guiding by etching of the substrate in the side regions.
Figure 11:
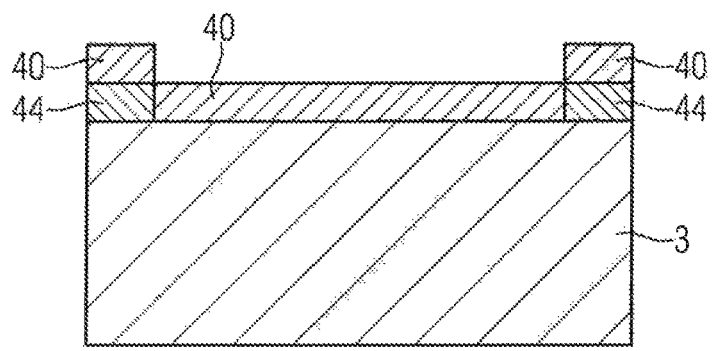
Figure 12:
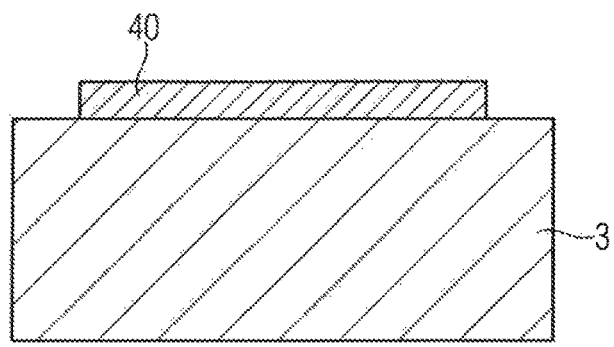
Figure 13:
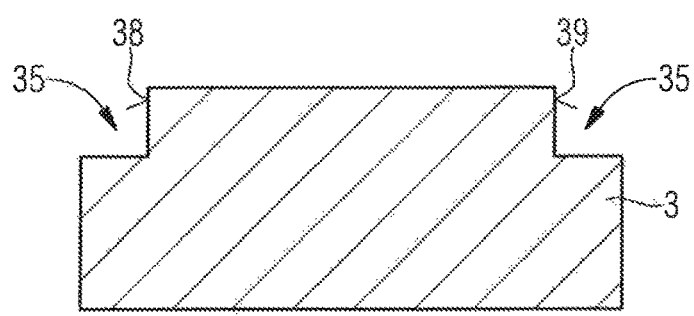

FIGS. 10 to 14 show method steps of another method of producing a laser diode, index guiding being achieved by the substrate 3 being etched in the region of the second and third layer structure 26, 27. FIG. 10 shows the method step in which a photomask 44 is applied onto the substrate 3. Subsequently, the free surface of the substrate 3 is coated with an etching mask 40 in the region of the etching mask opening 45 and the photomask 44. This method stage is represented in FIG. 11. Subsequently, the photomask 44 and the regions of the etching mask 40 arranged thereon are removed by a lift-off method. A structured etching mask 40 therefore remains, as is represented in FIG. 12. The etching mask 40 covers a central region of the substrate 3, onto which the first layer structure 15 is later intended to be applied. Subsequently, two second recesses 35 are introduced with the aid of an etching method into lateral surface regions of the substrate 3 which are not covered by the etching mask 40. Subsequently, the etching mask 40 is removed. This method stage is represented in FIG. 13. The two second recesses 35 respectively have a vertical fourth inner face 39.

Figure 14:
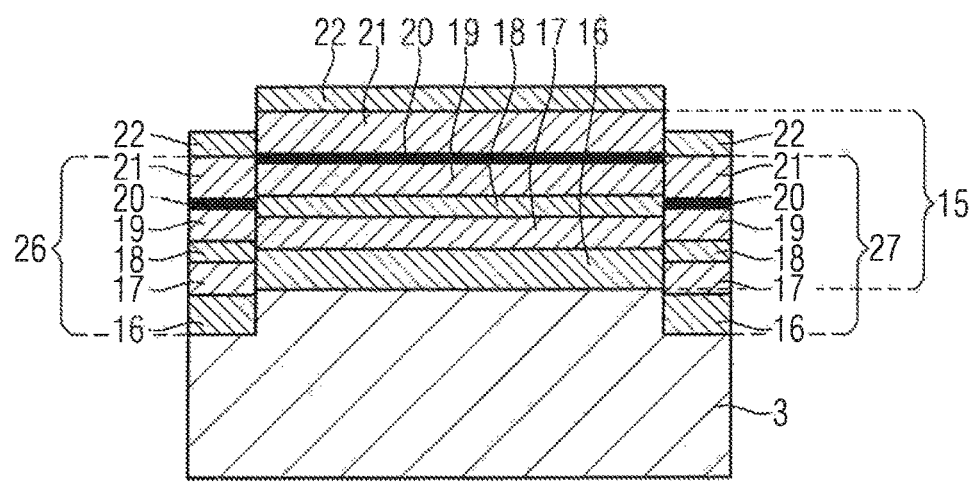

Subsequently, for example, with the aid of an epitaxial growth method, the layers of the first, second and third layer structures 15, 26, 27 are applied layerwise but simultaneously for the first, second and third layer structures 15, 26, 27 and a laser diode 1 is produced as represented in FIG. 14. The layer structures 15, 26, 27 of FIG. 14 correspond to the layer structures of FIG. 9, although in this example the active zone 18 of the first layer structure 15 is arranged higher than the active zones 18 of the second and third layer structures 26, 27. This method offers the same advantages as the method of FIGS. 6 to 9.

Figure 15:
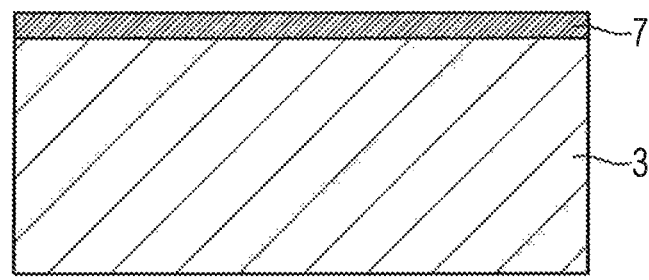
FIGS. 15 to 18 show method steps of producing a laser diode with index guiding by etching of an intermediate layer.
Figure 16:
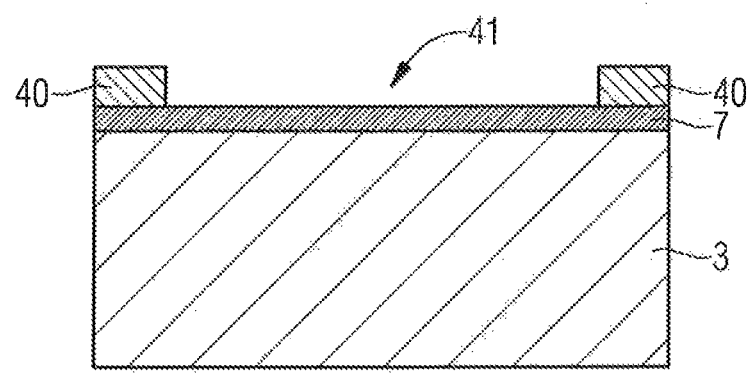
Figure 17:
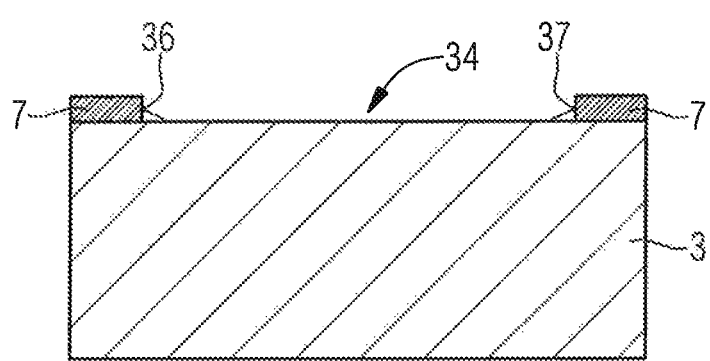

FIGS. 15 to 18 show method steps of another method of producing a laser diode 1. FIG. 15 shows a substrate 3, on which an intermediate layer 7 is arranged. An etching mask 40 is applied on the intermediate layer 7. The etching mask 40 has an etching opening 41. This method stage is represented in FIG. 16. Subsequently, the intermediate layer 7 is structured with the aid of an etching method, a first recess 34 being introduced into the intermediate layer 7 and the surface of the substrate 3 being exposed in the region of the first recess 34. The substrate 3 and the intermediate layer 7 constitute a carrier. This method state is represented in FIG. 17. Depending on the example selected, a recess as in FIG. 7 may also be introduced into the substrate 3 in the region of the etching opening 41. Furthermore, a first cover layer structured together with the intermediate layer 7 according to FIGS. 15 to 17, may be provided in addition to the intermediate layer 7. The first cover layer may be arranged between the substrate 3 and the intermediate layer 7, or on the intermediate layer 7.

Figure 18:
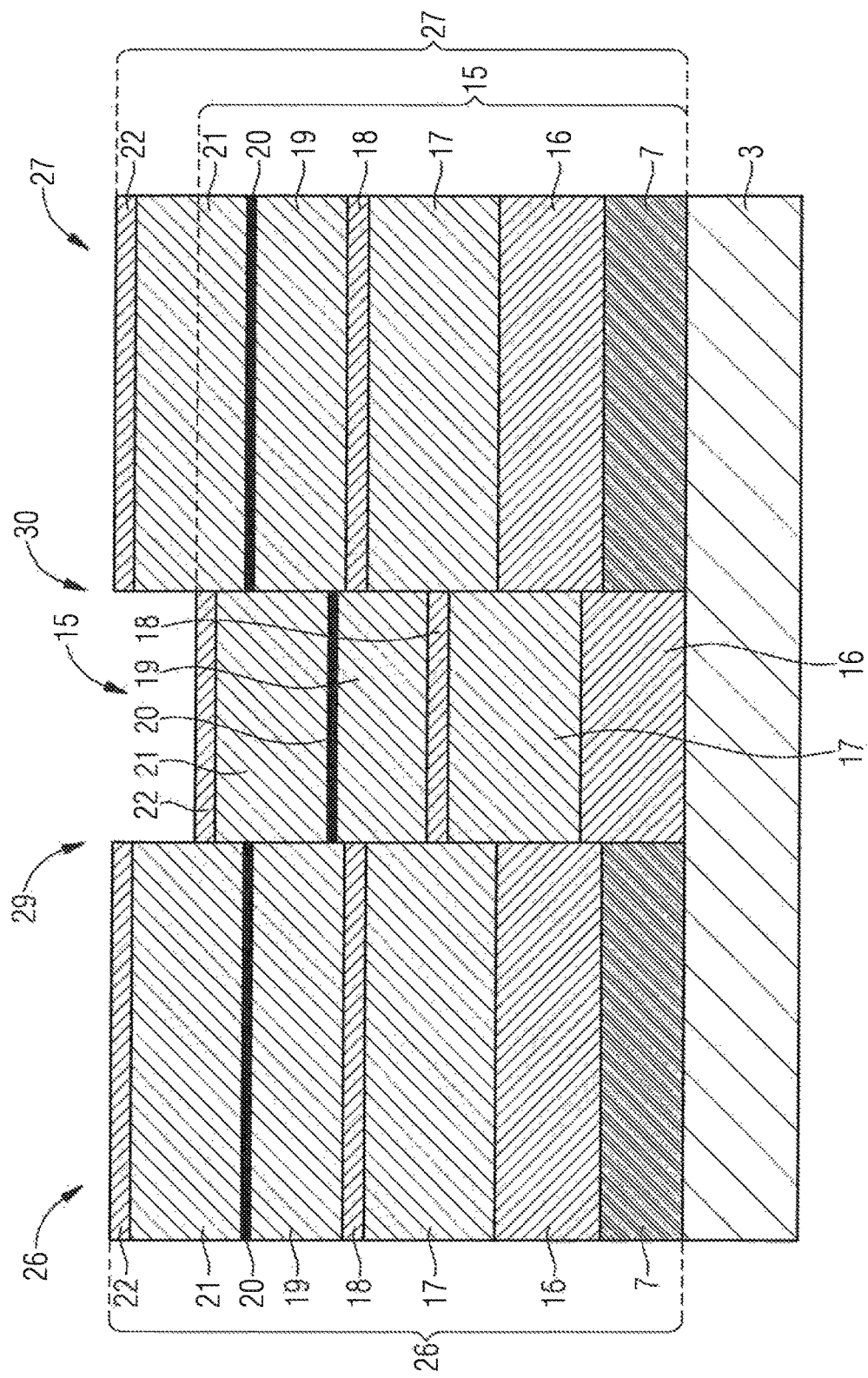

Subsequently, the layers for a laser diode 1 are applied successively onto the arrangement of FIG. 17 so that the first, second and third layer structures 15, 26, 27 are obtained, as is represented in FIG. 18. By the first recess 34, the first layer structure 15, which is arranged in the region of the ridge structure 23, is arranged offset relative to the second and third layer structures 26, 27. Since the first and second inner faces 36, 37 of the first recess 34 are arranged perpendicularly to the plane of the substrate 3, during the deposition of the layers of the layer structures an abrupt transition is produced between the first, the second and the third layer structures 15, 26, 27. The displacement in the height position is so great that the active zone 18 of the first layer structure 15 is bounded laterally by the n-waveguide layers 17 of the second and third layer structures 26, 27. The intermediate layer 7 constitutes a layer that hinders, in particular prevents, the flow of an electrical current. Depending on the example selected, the intermediate layer 7 may, for example, be configured in the form of an insulating layer, for example, in the form of an undoped gallium nitride or undoped aluminum nitride. Furthermore, depending on the example selected, the intermediate layer 7 may be configured as a p-conductive layer when the substrate 3 is configured as an n-conductive material. Furthermore, depending on the example selected, the intermediate layer 7 may be configured as an n-conductive layer when the substrate 3 is configured as a p-conductive material. In this example, a blocking pn junction for a current flow between the p-contact and the n-contact of the laser diode is therefore formed between the intermediate layer 7 and the substrate 3. The laser diode of FIG. 18 has the advantage over the examples of FIGS. 9 and 14 that the current flow is concentrated in the region of the active zone 18 of the first layer structure 15.

Depending on the inclination angle of the first and second inner faces 36, 37 of the first recess 34, differently steep or abrupt transitions may be produced between the layer structures 15, 26, 27, as has been represented schematically with the aid of FIGS. 2 to 5 for two selected angles. Correspondingly inclinedly arranged intermediate regions 29, 30 according to FIGS. 4 and 5 may therefore also be produced in the methods according to FIGS. 6 to 9 or 10 to 14, or FIGS. 15 to 18. The inclination angles of the layers of the intermediate regions 29, 30 may lie between 5° and 90°.

Figure 19:
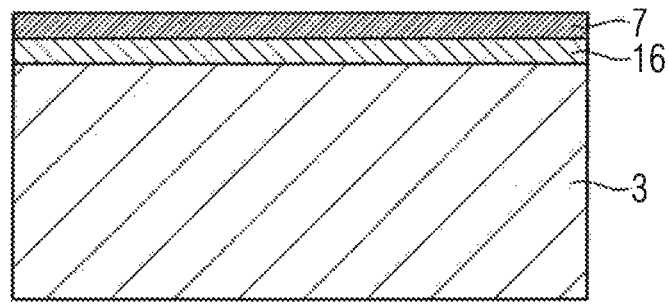
FIGS. 19 to 22 show method steps of producing a laser diode with index guiding by etching of a layer stack having a cover layer and a conductive or nonconductive current limiting layer.
Figure 20:
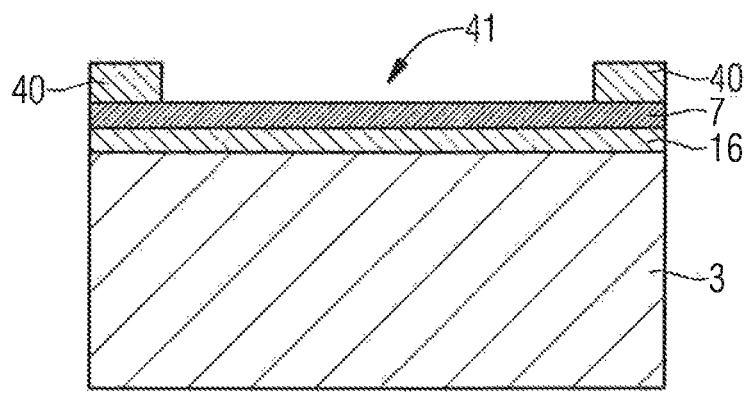
Figure 21:
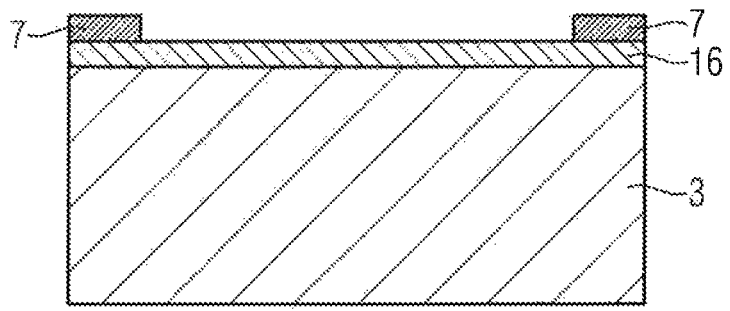

FIGS. 19 to 22 show method steps of another method of producing a laser diode 1, a substrate 3 that is covered with a first cover layer 16 being provided in FIG. 19. The first cover layer 16 may, for example, be negatively doped. A blocking layer 7 is arranged on the first cover layer 16. Subsequently, an etching mask 40 that delimits an etching opening 41 is applied onto the blocking layer 7 as represented in FIG. 20. The intermediate layer 7 is then structured, i.e. removed in the region of the etching opening 41, with the aid of the etching mask 40. The etching mask 40 is subsequently removed and an arrangement as represented in FIG. 21 is obtained. The substrate 3, the first cover layer 16 and the intermediate layer 7 constitute a carrier. Furthermore, the first cover layer 16 may also be arranged above the intermediate layer 7. In this example, the first cover layer 16 is structured, i.e. removed in the region of the etching opening 41, together with the intermediate layer 7.

Figure 22:
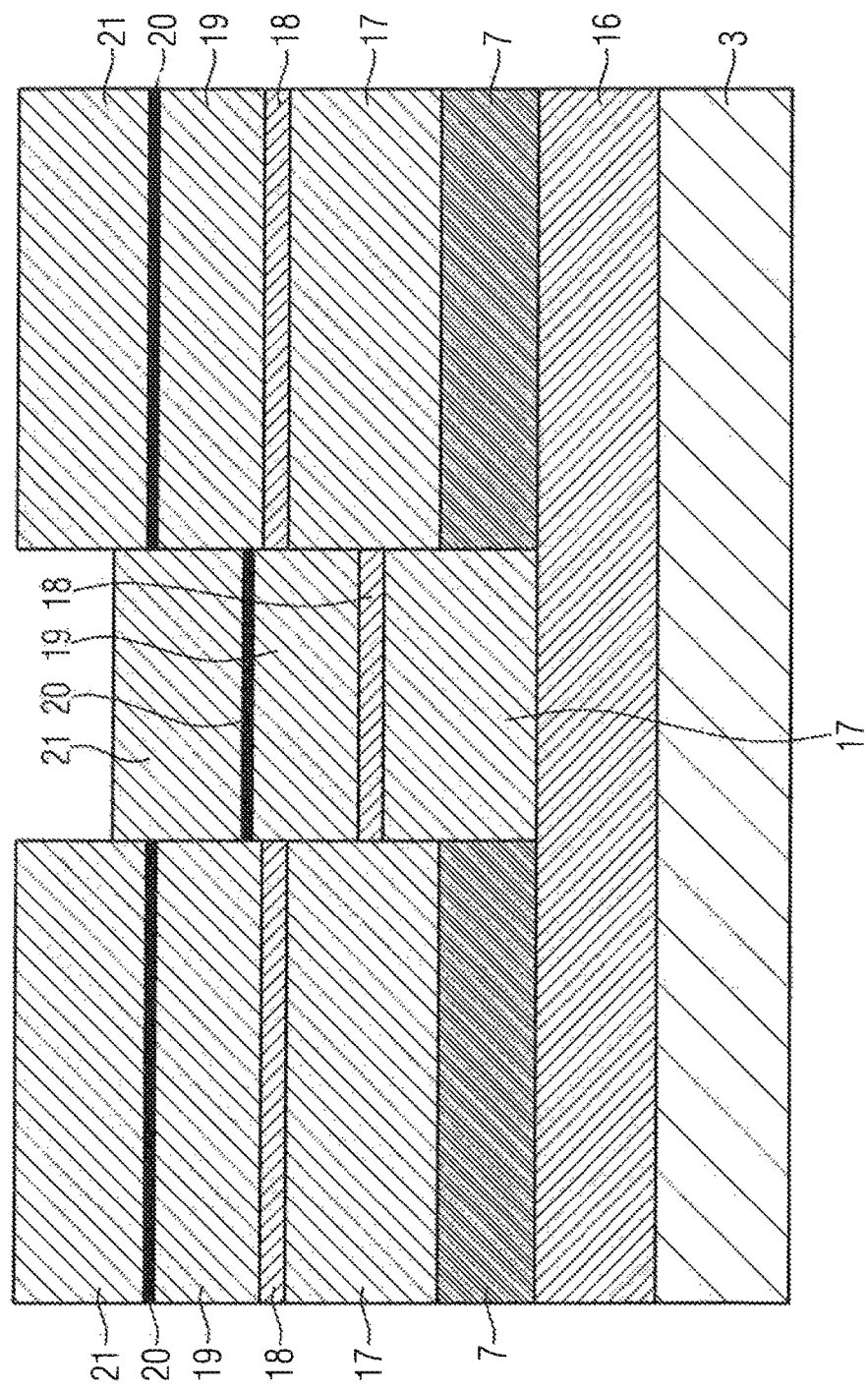
Figure 23:
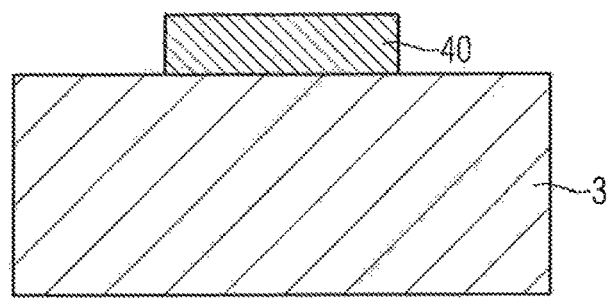
FIGS. 23 to 27 show method steps of producing a laser diode with index guiding by substrate etching and application of an intermediate layer.

During subsequent method steps, the first and the second and the third layer structure 15, 26, 27 are successively epitaxially deposited together layer by layer in the growth direction, i.e. along the Y axis, the layer structures not having a first cover layer 16 in this example since it has already been deposited in the preceding method steps. The laser diode 1 of FIG. 22 is configured according to the laser diode 1 of FIG. 18, the blocking layer 7 being arranged above the first cover layer 16 in the region of the second and third layer structures 26, 27. In this example, the intermediate layer 7 is, for example, configured as an electrically insulating layer.

Figure 24:
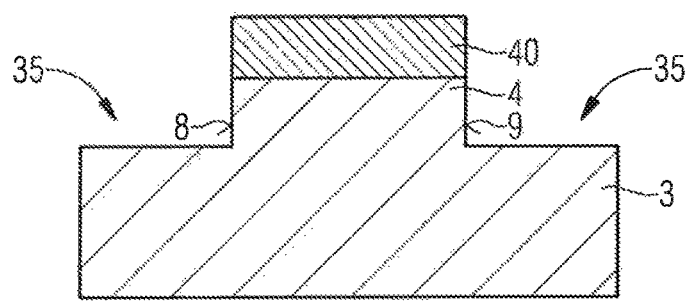
Figure 25:
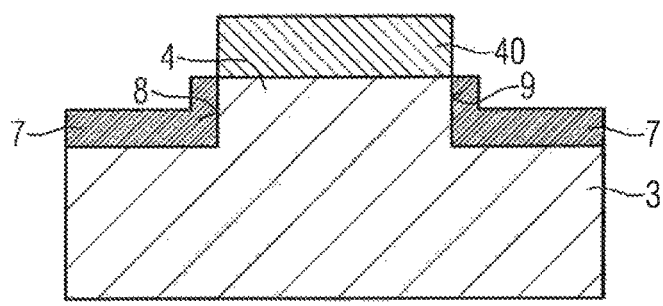

FIGS. 23 to 27 describe method steps of producing a laser diode with index guiding by substrate etching and by the provision of a current limiting layer. FIGS. 23 to 27 show method steps of a method of producing a laser diode configured according to FIG. 1A. A substrate 3, onto which an e.g. lithographically structured etching mask 40 is applied, is provided in FIG. 23. The etching mask 40 defines the width and length of the first layer structure produced later. Subsequently, with the aid of the etching mask 40, a second recess 35 is respectively introduced into the substrate 3 laterally with respect to the etching mask 40 on both sides, as is represented in FIG. 24. In this case, a web 4 is formed out of the substrate 3. During a subsequent method step, an intermediate layer 7 is deposited onto the free surfaces of the substrate 3 and onto side faces 8, 9 of the web 4. The side faces 8, 9 are covered fully with the intermediate layer 7 in the example represented. The intermediate layer 7 is formed to limit or prevent a current flow. The intermediate layer 7 covers both the bottom faces of the second recesses 35 and side faces 8, 9 of the web 4 of the substrate 3. In this case, the intermediate layer 7 itself may be configured in the form of an insulating material. In this example, the intermediate layer 7 may, for example, be formed from undoped gallium nitride, undoped aluminum nitride, undoped indium gallium nitride, undoped aluminum gallium nitride or undoped aluminum indium gallium nitride. Furthermore, the intermediate layer 7 may be configured in the form of a positively doped material when the substrate 3 consists of a negatively doped material. A blocking pn contact layer is therefore formed between the intermediate layer 7 and the substrate 3. In this example, the positively doped intermediate layer 7 may, for example, be formed from gallium nitride, aluminum nitride, indium gallium nitride, aluminum gallium nitride or aluminum indium gallium nitride, the intermediate layer 7 being, for example, doped with magnesium or zinc. This method stage is represented in FIG. 25. Likewise, the intermediate layer 7 may be negatively doped and the substrate 3 positively doped.

Figure 26:
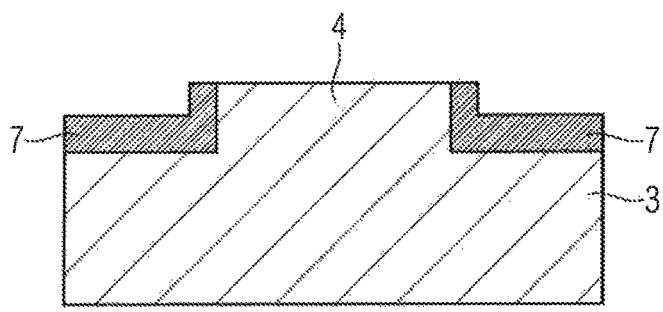
Figure 27:
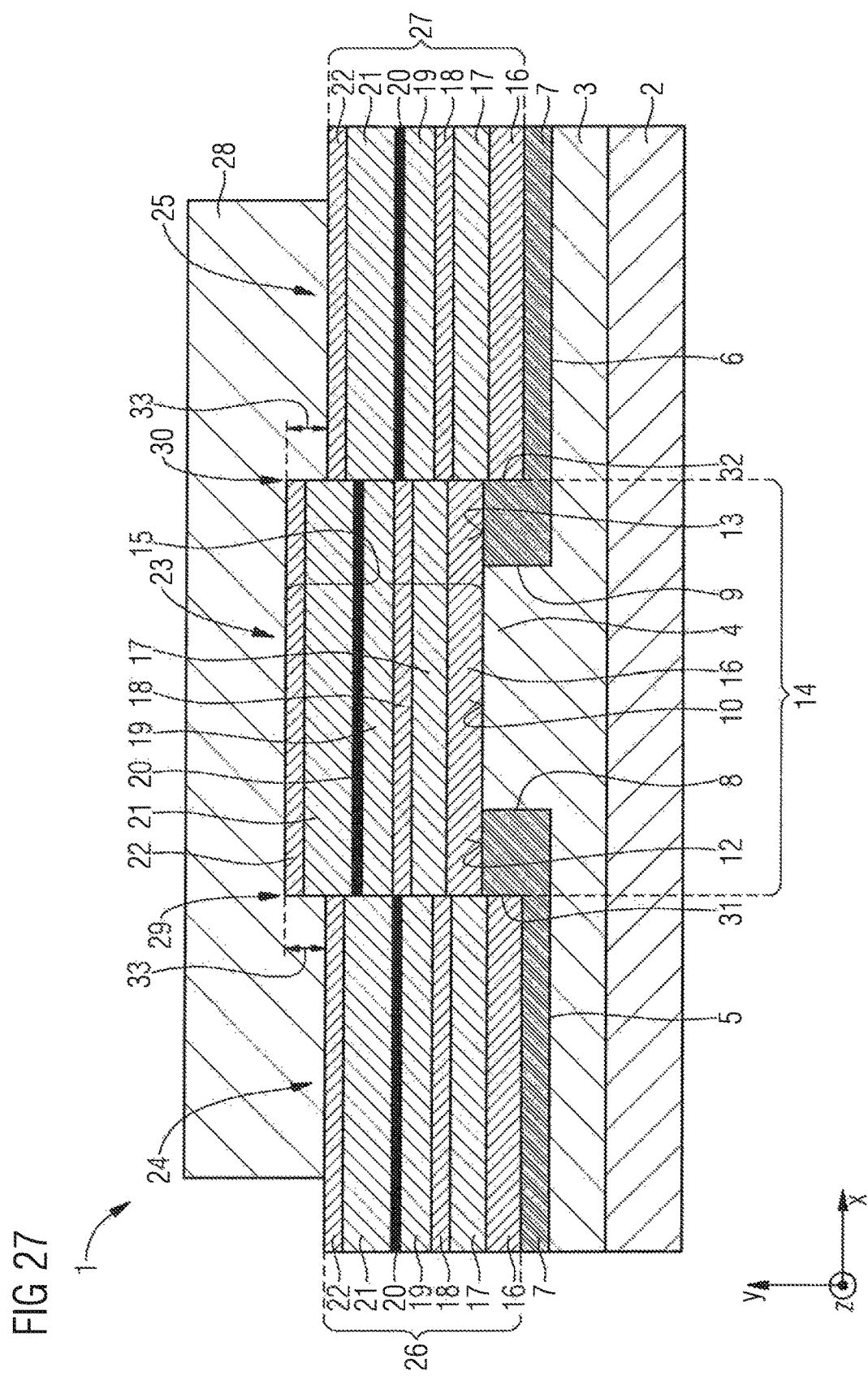

In a subsequent method step, the etching mask 40 is removed. This method stage is represented in FIG. 26. The intermediate layer 7 and the substrate 3 constitute a carrier. Subsequently, the layer sequence is deposited onto the upper side of the arrangement of FIG. 26 according to the desired construction of the laser diode. In this case, a laser diode according to FIG. 27 is obtained because of the structured surface. The layer sequences of the first, second and third layer structures 15, 26, 27 are the same, and correspond to the layer sequence of the laser diode 1 of FIG. 1A.

Figure 28:
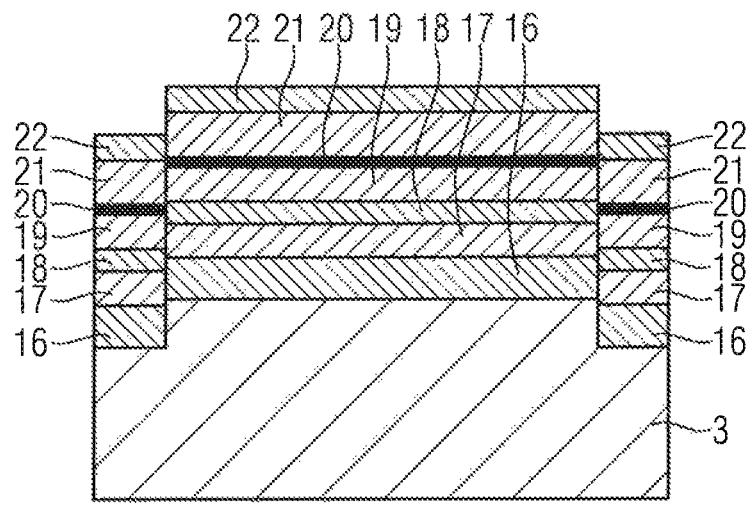
FIGS. 28 to 31 show method steps of producing a laser diode with index guiding by substrate etching and p-side current limitation.
Figure 29:
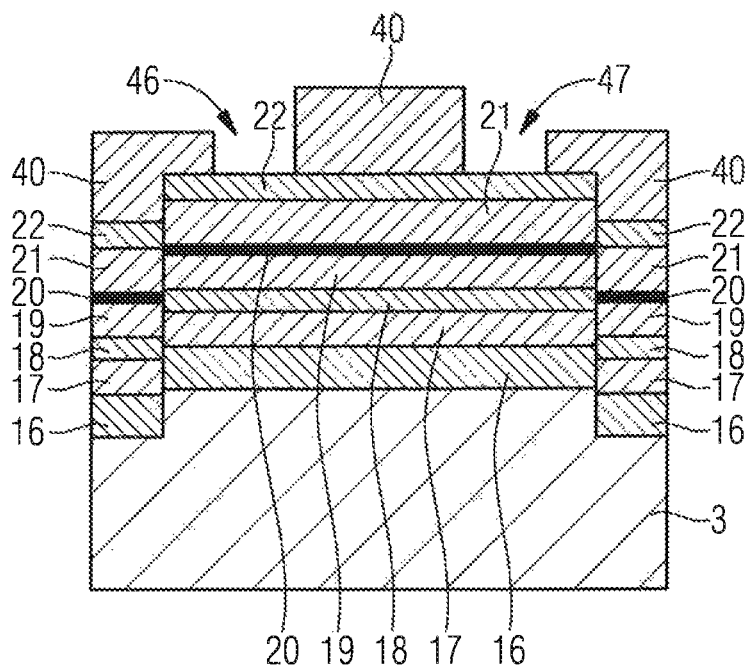

FIGS. 28 to 31 show another method of producing a laser diode with index guiding by substrate etching and a current limiting layer on the p side. FIG. 28 shows a laser diode 1 configured according to the laser diode of FIG. 14 and has been produced by a corresponding method. An etching mask 40 is applied onto the contact layer 22 of the laser diode. The etching mask 40 comprises further etching openings 46, 47. The etching openings 46, 47 reach as far as the contact layer 22 and are arranged over the first layer structure 15 at a predetermined distance. The etching openings 46, 47 are made over the entire length of the laser diode 1. The etching openings 46, 47 are furthermore arranged mirror-symmetrically with respect to a middle of the first layer structure 15. This method stage is represented in FIG. 29.

Figure 30:
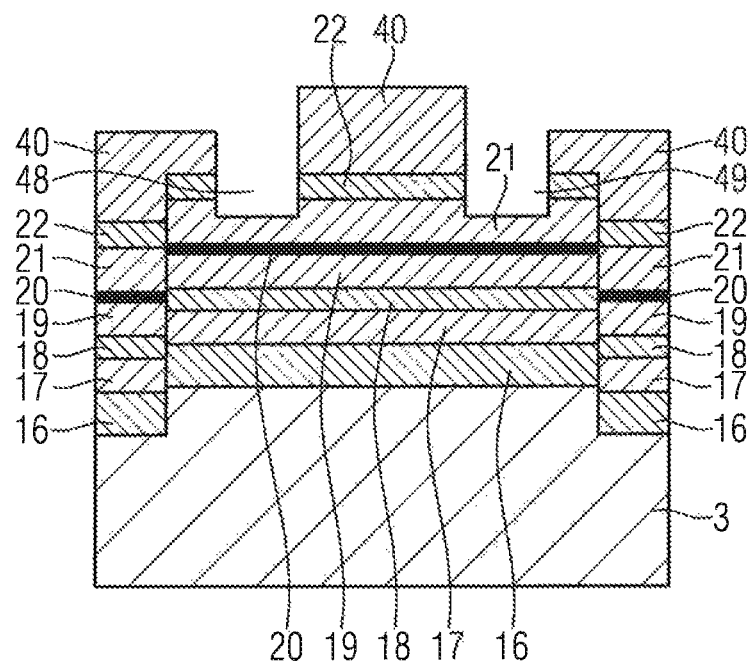
Figure 31:
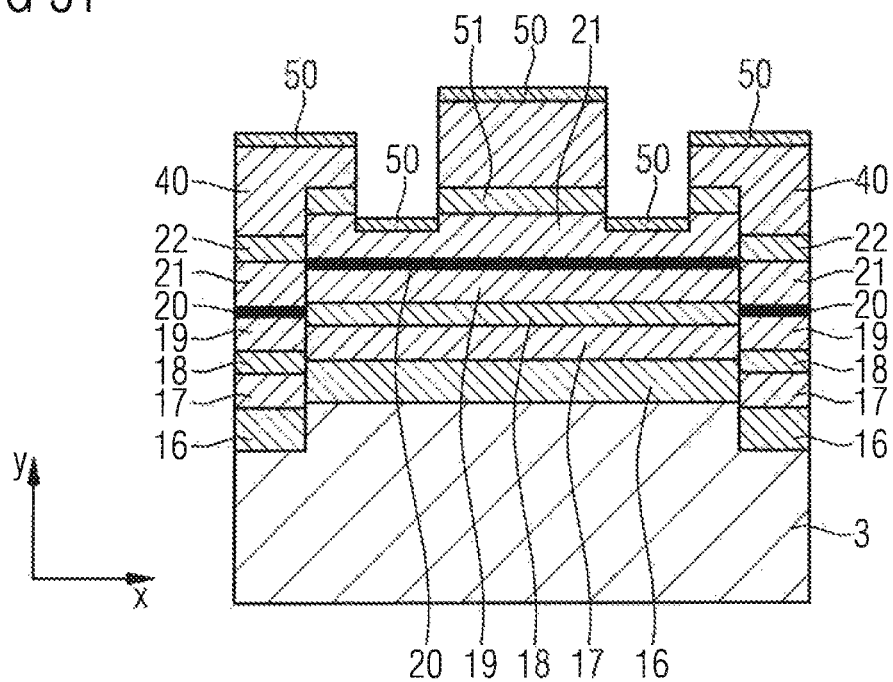
Figure 32:
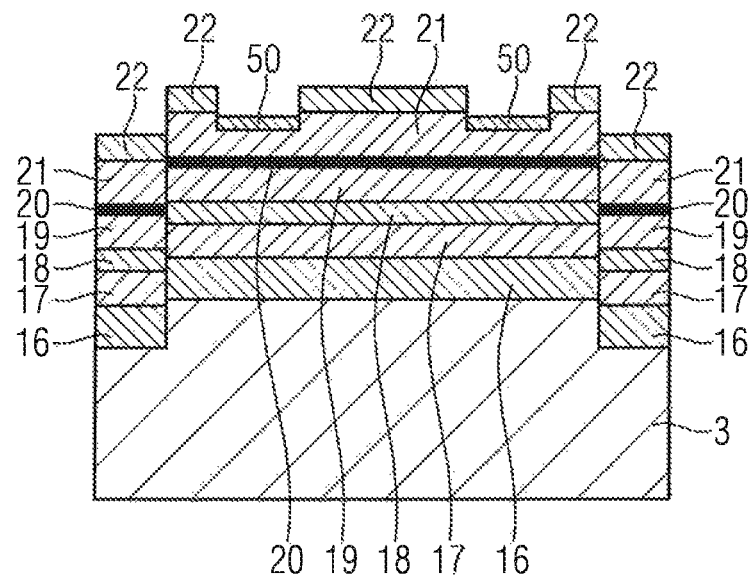
FIGS. 32 to 35 show method steps of producing a laser diode with index guiding by substrate etching and current limitation on the p side.
Figure 33:
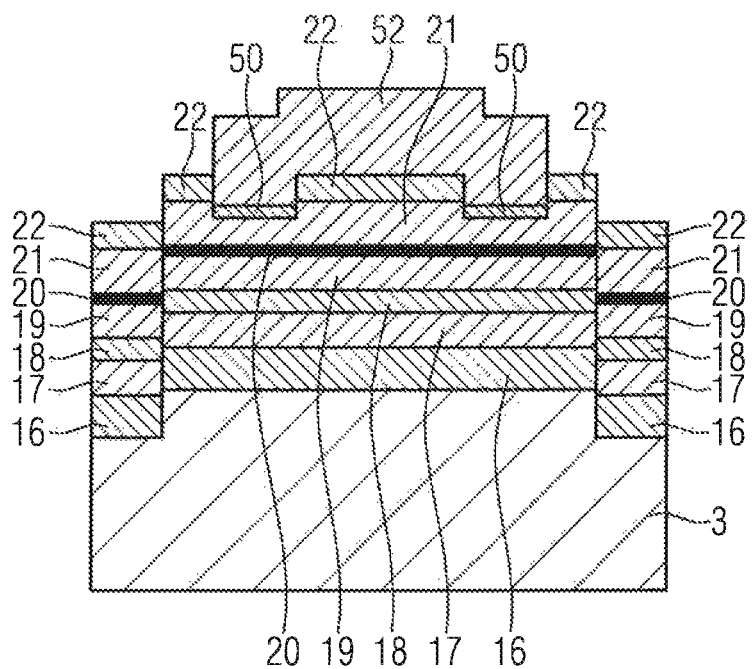
Figure 34:
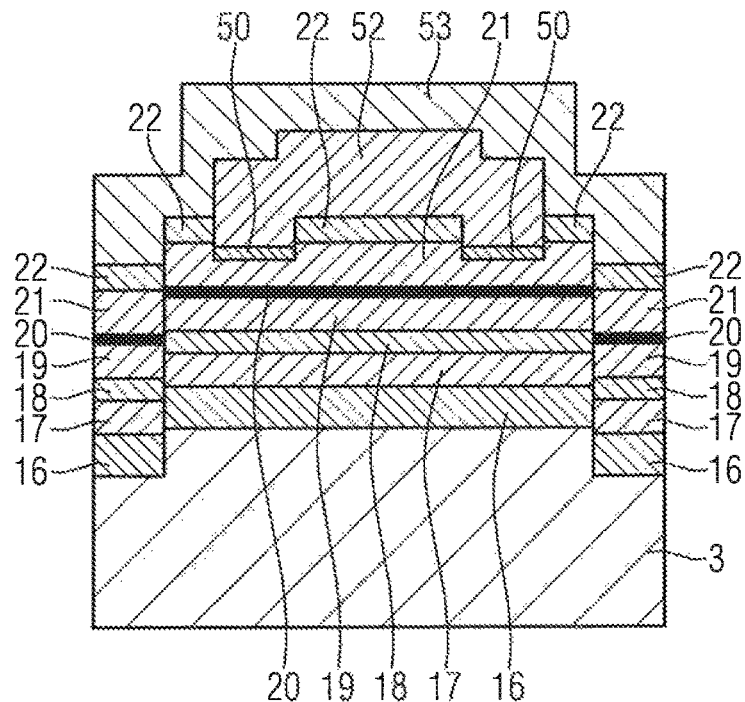
Figure 35:
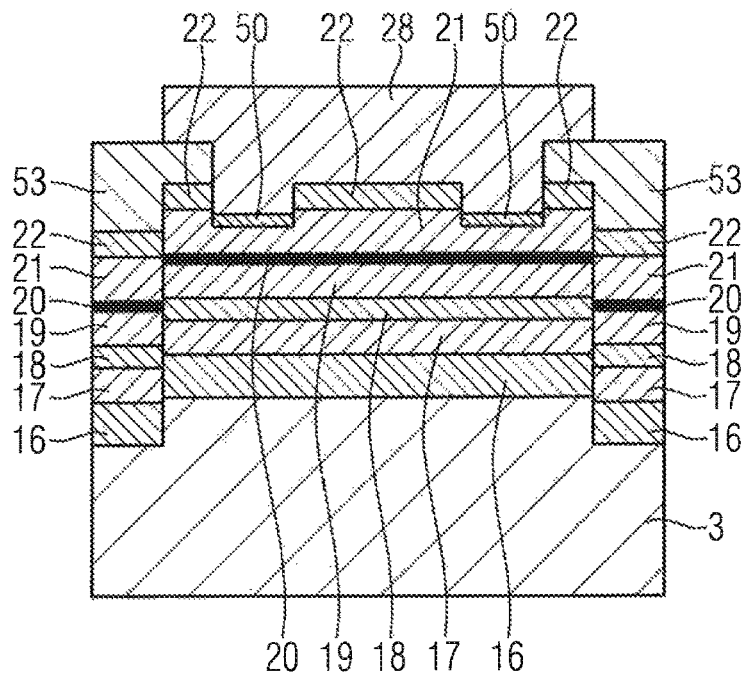

Subsequently, with the aid of the etching mask 40, the contact layer 22 is removed in the region of the first and second further etching openings 46, 47 with the aid of an etching method. Furthermore, further recesses 48, 49 are introduced into the second cover layer 21 of the first layer structure 15. This method stage is represented in FIG. 30. Subsequently, the etching mask 40 is covered with an insulation layer 50. In this case, the further recesses 48, 49 of the second cover layer 21 are also filled. In this way, a contact 51 which has a smaller width than the first layer structure 15 is obtained on the first layer structure 15. Current limitation in relation to the width of the active zone 18 of the first layer structure 15 is therefore achieved. This method stage is represented in FIG. 31. Subsequently, with the aid of a lift-off method, the etching mask 40 which is, for example, formed from photoresist, is removed. In this case, the insulation layer 50 arranged on the etching mask is also removed. This method stage is represented in FIG. 32. In a subsequent method step, a central region 52 of the contact layer 22 and the adjoining insulation layers 50 arranged in the further recesses 48, 49, are covered with a photoresist layer 52. In the subsequent method step, a second insulation layer 53 is applied onto the upper side of the arrangement. This method stage is represented in FIG. 34. In a subsequent method step, the photoresist layer 52 is removed, as is the second insulation layer 53 in a central region. Subsequently, a p-metallization 28 is applied onto the central region of the contact layer 22. This method state is represented in FIG. 35.

Figure 36:
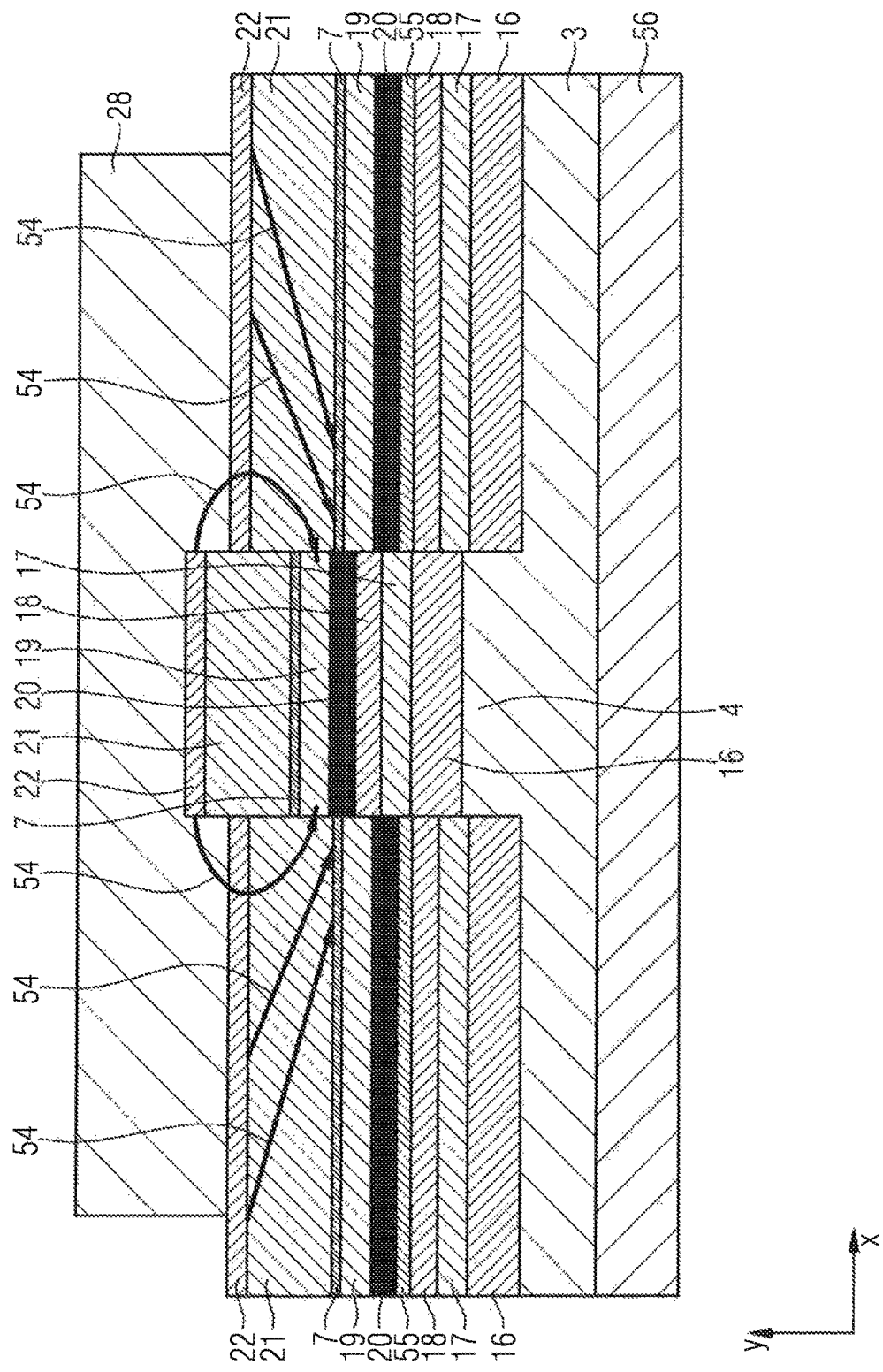
FIG. 36 shows a cross section through a laser diode having index guiding by substrate etching current limitation on the p side.

FIG. 36 shows another example of a laser diode 1 in which both an intermediate layer 7 is arranged in the second and third layer structures 26, 27 and an intermediate layer 7 is arranged in the first layer structure 15. In the example represented, the intermediate layer 7 is respectively arranged between the p-waveguide 19 and the second cover layer 21. The intermediate layer 7 is configured as a current blocking layer so that only a small vertical current flow, or no vertical current flow, can take place between the p-contact 22 and the substrate 3. However, the intermediate layer 7 of the first layer structure 15 and the intermediate layers 7 of the second and third layer structures 26, 27 have different height positions in relation to the Y axis. In the example selected, the intermediate layer 7 of the first layer structure 15 is arranged above the intermediate layers 7 of the second and third layer structures 26, 27. The difference in the height positions is greater than the thickness of the intermediate layer 7. In this example, therefore, the p-waveguide 19 of the first layer structure 15 laterally adjoins the second cover layer 21 of the second and third layer structures 26, 27. In this way, a current flow between the p-contact 22 in the direction of the first layer structure 15 and its active zone 18 can be concentrated through this interface. Corresponding current paths 54 are schematically represented in the form of arrows. The intermediate layer 7 is configured as an insulation layer. Furthermore, the active zone of the first layer structure 15 is arranged higher than the active zones of the second and third layer structures 26, 27. The active zone 18 of the first layer structure 15 laterally adjoins the blocking layer 20 for electrons. The blocking layer 20 for electrons has a lower refractive index so that lateral guiding of the laser mode is thereby achieved. Furthermore, by the provision of the current-blocking intermediate layer 7, a defined current path is dictated, which concentrates the current flow in the region of the first layer structure 15. Charge carrier losses are thereby reduced. Furthermore, an increase of the quantum efficiency is achieved.

In this example, the substrate 3 comprises a web 4 corresponding to the example of FIG. 1A. Furthermore, the layers of the first layer structure 15, of the second layer structure 26 and of the third layer structure 27 are constructed according to FIG. 1A. Depending on the example selected, a spacer layer 55 that is positively doped may be provided between the active zone 18 and the blocking layer 20. In the example represented, the p-waveguide 19 is arranged in the layer structure on the blocking layer 20. The intermediate layer 7 is applied onto the p-waveguide 19. This is followed by the second cover layer 21, which is positively doped. Furthermore, an n-metallization 56 is applied on the lower side of the substrate 3.

Figure 37:
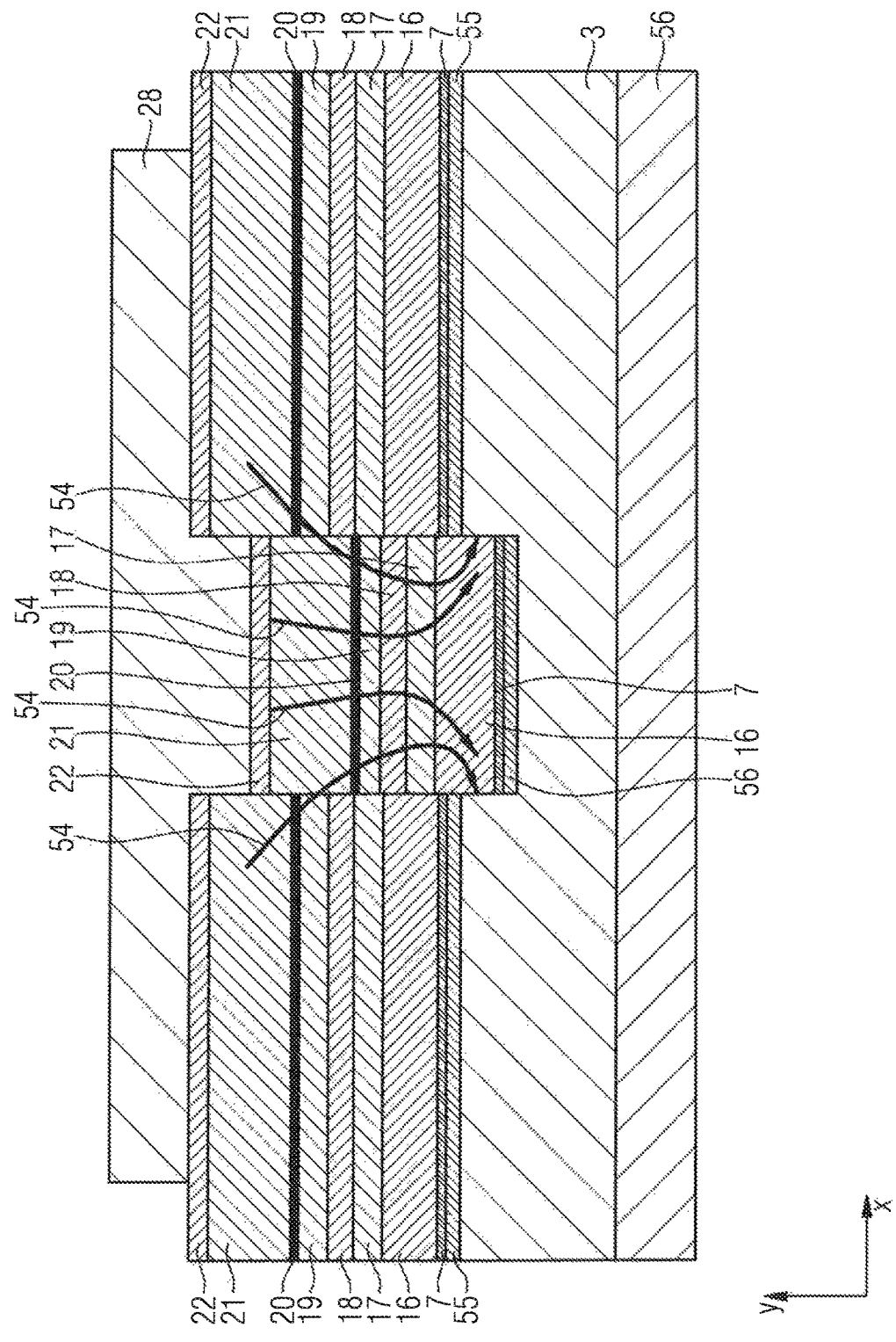
FIG. 37 shows a cross section through a laser diode having index guiding by substrate etching and current limitation on the n side.

FIG. 37 shows another example of a laser diode 1 in which the substrate 3 comprises a recess 35 in which the first layer structure 15 is partially arranged. The layer construction of the first, of the second and of the third layer structures 15, 26, 27 have the same layer sequence, the layer sequence of the first layer structure 15 being arranged lower in height than the layer sequences of the second and third layer structures. Provided next to the substrate 3, there is a spacer layer 55, an intermediate layer 7, a first cover layer 16, an n-waveguide layer 17, an active zone 18, a p-waveguide layer 19, a second cover layer 21 and a contact layer 22. An n-metallization 56 is applied on the lower side of the electrically conductive substrate 3. Because of the arrangement of the intermediate layer 7, which is configured as a current blocking layer, a current flow is concentrated according to the current paths 54, which are represented in the form of arrows, into the region of the active zone 18 of the first layer structure 15. A lateral waveguide structure without ridge etching is also achieved by this arrangement. Lateral index guiding of the laser mode takes place because of the height offset between the first layer structure 15 and the second and third layer structures 26, 27 arranged on either side. The active zone 18 of the first layer structure 15 laterally adjoins the first cover layer 16. The first cover layer 16 has a lower refractive index than the active zone 18.

Furthermore, defined current paths 54 for the current flow are dictated by the provision of the intermediate layer 7 acting as a current blocking layer. The current flow is concentrated onto the region of the active zone 18 of the first layer structure 15. Charge carrier losses are thereby reduced. Furthermore, an increase of the quantum efficiency is thereby achieved.

The examples of FIGS. 36 and 37 may also comprise intermediate regions 29, 30 between the first layer structure 15 and the second layer structure 26 and/or between the first layer structure 15 and the third layer structure 27 with inclinedly arranged layers arranged in a similar way to FIGS. 4 and 5. In this case, the inclination angle of the layers in the intermediate regions may lie between 5° and 90°. The layers in the intermediate regions 29, 30 are arranged parallel to one another.

Likewise, the examples of FIGS. 9, 14, 35, 27, 22, 18 may also comprise intermediate regions 29, 30 between the first layer structure 15 and the second layer structure 26 and/or between the first layer structure 15 and the third layer structure 27 with inclinedly arranged layers. The definition of the inclination, i.e. of the inclination angle of the layers in the intermediate regions, is established by a corresponding configuration of the inclination faces of the side faces of the web 4, or of the intermediate layer 7, or of the side faces or inner faces of the first and recesses 34, 35, respectively.

Depending on the example selected, the blocking layer 20 may be omitted from the examples described. In addition, in various examples, further layers may be provided between the active zone, the waveguide layers and the cover layers. Furthermore, individual layers may also be omitted from the examples described. The active zone 18 may, for example, be configured as a quantum well structure. In addition, the active zone may also be configured as a pn junction. In addition, in the examples described the transition between the first layer structure 15 and the second layer structure 26 in the first intermediate region 29 may take place at a different angle than the transition between the first layer structure 15 and the third layer structure 27 in the second intermediate region 30. For example, the transition may merge abruptly at a 90° angle in one intermediate region and as an angle of 5° in the other intermediate region. All other different angle ranges between 5° and 90° are, however, also possible for the transition in the two intermediate regions.

With the aid of the methods described, laser diodes with various material systems can be produced. Particularly in the material system aluminum indium gallium nitride, the proposed methods offer advantages for the production of an index-guided ridge waveguide laser diode. By the proposed methods, the use of an etch stop layer in the aluminum indium gallium nitride material system can be obviated. Nevertheless, the methods described and the examples described may also be applied to other material systems, for example, laser diodes based on gallium arsenide or indium phosphide.

Our methods of producing the laser diode have the advantage that multistage ridge etching with intermediate checks can be obviated. It is therefore possible to avoid damage to the active zone, which may occur during etching of the ridge structure, particularly in the case of dry etching, and which may lead to absorption centers, leakage current paths and component stability problems. In the eventuality that slight variations over a wafer, or from wafer to wafer, in the composition of the layers to be etched may lead to different ridge etching rates is furthermore avoided. Etching depth variations due to this, and resulting high variances in the laser parameters, are therefore avoided.

Furthermore, the proposed methods avoid oxidation of the semiconductor surface taking place during intermediate checks during the etching method. The component reject rate is therefore improved.

Our methods have the advantage that an index-guided laser diode is provided, without ridge technology and elaborate multiple epitaxy with a plurality of epitaxy steps and etching steps being required any longer. This leads to advantages in terms of a low operating voltage by virtue of a large-area contact pad. In addition, elaborate epitaxial overgrowth is not necessary. Furthermore, elaborate ridge etching can be obviated. The methods have the advantage that structuring of the component to form a ridge structure offset in height position relative to the edge regions is carried out before the formation of the active zone. The structuring can be carried out below the active zone in the epitaxy region. Preferably, this index-defining etching may be carried out directly in the substrate. As an alternative, an epitaxial auxiliary layer deposited on the substrate may be etched. For a large-area contact connection face, a current shield on the n side may additionally be integrated. To this end, an n-conductive substrate may be rendered partially nonconductive, for example, by diffusion or implantation or the like. Furthermore, an auxiliary layer to be etched may be configured to be undoped (nonconductive) or p-doped so that a blocking pn junction is formed in the nonetched region.

The intermediate layer 7 may, particularly in FIG. 37, also be integrated directly into the substrate 3 by the substrate 3 being rendered nonconductive in the corresponding surface regions. The formation of the intermediate layer 7, which does not conduct current may, for example, be carried out by corresponding diffusion or implantation. The substrate 3 is generally configured to be n-conductive.

Depending on the example selected, the structuring method may also be applied to the substrate, on which a first cover layer 16 and an n-waveguide layer 17 are already applied. The structuring method is carried out correspondingly, with a recess or a web on the layer already deposited being formed, and further layers with the active zone subsequently being deposited epitaxially.

In all examples, the intermediate layer 7 may be deposited epitaxially. In this case, depending on the example selected, a dopant for a desired doping of the intermediate layer 7 may be incorporated during the deposition, i.e. during the layer growth of the intermediate layer 7. In this case, the dopant is essentially incorporated at lattice sites. Dopant concentration onto interstitial lattice sites is thereby reduced, and in particular avoided. Dopant migration into the active zone during operation of the laser diode is therefore reduced, in particular avoided. Nonradiative recombination of charge carriers in the active zone is thereby reduced, in particular avoided. The efficiency of the laser diode is thereby increased. Furthermore, the risk of additional heating is reduced.

The intermediate layer 7 is, for example, positively doped and arranged adjacent to at least one negatively doped semiconductor layer, in particular between two negatively doped semiconductor layers. In this way, a blocking pn junction is produced, which hinders or prevents a current flow. The intermediate layer 7 may be arranged adjacent to the first cover layer 16, and/or adjacent to the n-waveguide layer 17. The intermediate layer 7 may in this case be arranged between the substrate 3 and the first cover layer 16, or in the first cover layer 16. Furthermore, the intermediate layer 7 may be arranged in the n-waveguide layer 17 or between the first cover layer 16 and the n-waveguide layer 17, or between the n-waveguide layer 17 and the active zone 18.

The laser diode described may in particular be used for an AlGaInN system, in particular for laser diodes which generate visible light.

One basic idea of the methods consists in structuring of the surface of the layer arrangement taking place before the deposition of the active zone so that, during subsequent deposition of the layers with the active zone, the active zone is arranged in a ridge region at a different height position compared to the active zones of the edge regions. By this different height position, a variation of the refractive index is achieved in lateral regions, particularly in the intermediate regions between the ridge structure and the edge regions so that lateral guiding of the laser mode is produced in the region of the active zone of the ridge structure.

Although our laser diodes and methods have been illustrated and described in detail by the preferred examples, this disclosure is not restricted to the examples disclosed and other variants may be derived therefrom by those skilled in the art without departing from the protective scope of the appended claims.

This application claims priority of DE 10 2015 104 206.1, the subject matter of which is incorporated herein by reference.

The invention claimed is:

1. A laser diode having a layer arrangement with layers arranged on one another, the layer arrangement comprising a first, a second and a third layer structure with at least one active zone and two waveguide layers, the active zone being arranged between the two waveguide layers, and having
   a first layer structure, the first layer structure extending along a Z axis in a longitudinal direction, along an X axis in a transverse direction and along a Y axis in a height direction, and
   a second and a third layer structure arranged along the Z axis on opposite longitudinal sides of the first layer structure and adjoining the first layer structure,
   wherein the active zone of the first layer structure is arranged offset in height relative to the active zones of the second and third layer structures,
   the active zone is arranged between a p contact and an n contact, an intermediate layer being arranged laterally with respect to the first layer structure in the second and third layer structures, the intermediate layer configured as an electrically blocking layer that hinders or prevents a current flow, and the intermediate layer being arranged between the active zone and the n contact, and
   the first layer structure comprises an intermediate layer, the intermediate layer of the first layer structure preventing a current flow, and the intermediate layer of the first layer structure is arranged offset in height relative to the intermediate layers of the second and third layer structures such that an electrically conductive connection is formed laterally between the second and third layer structures and the first layer structure so that an electrically conductive connection is formed between a p contact and an n contact via the active zone of the first layer structure.

2. The laser diode according to claim 1, wherein the active zone of the second and third layer structures are arranged at the same height.

3. The laser diode according to claim 1, wherein the active zone of the first layer structure is arranged offset in height by at least one thickness of the active zone with respect to the active zone of the second and/or the third layer structure.

4. The laser diode according to claim 1, further comprising a carrier, the layer arrangement being arranged with the active zone and the waveguide layers on the carrier, the first layer structure being arranged on a web of a substrate.

5. The laser diode according to claim 1, further comprising a carrier, the layer arrangement being arranged with the active zone and the waveguide layers on the carrier, the first layer structure being arranged in a recess of the carrier.

6. The laser diode according to claim 1, wherein the first layer structure comprises at least one first cover layer adjoining the first waveguide layer, the first layer structure comprising at least one second cover layer arranged above the second waveguide layer, the second and third layer structures comprising at least one first cover layer adjoining the first waveguide layer, the second and third layer structures comprising at least one second cover layer arranged above the second waveguide layer.

7. The laser diode according to claim 1, wherein the first layer structure is provided with an electrical p contact, the first layer structure being arranged on a strip-like surface, the strip-like surface comprising a web, an intermediate layer respectively being arranged on the web on both sides along a longitudinal side, the intermediate layer having a low electrical conductivity or no electrical conductivity, the p contact having a wider extent than the web in the X direction.

8. The laser diode according to claim 1, wherein the intermediate layer is formed as an epitaxially grown layer, and the intermediate layer comprises epitaxially grown doping.

9. The laser diode according to claim 1, wherein the second and third layer structures connect respectively via an intermediate region to the first layer structure, and wherein the second and third layer structures in the intermediate region are arranged inclined by 5° to 90° with respect to the X-Y plane of the first layer structure.

10. A method of producing the laser diode according to claim 1, wherein a layer arrangement having a first, a second and a third layer structure with layers arranged on one another is produced, the layer arrangement comprising at least one active zone and two waveguide layers, the active zone being arranged between the two waveguide layers, the layer arrangement being produced such that a first layer structure is formed along a Z axis in a longitudinal direction, along an X axis in a transverse direction and along a Y axis in a height direction, a second and a third layer structure being formed along the Z axis on opposite longitudinal sides of the first layer structure and adjoining the first layer structure, and the active zone of the first layer structure being arranged offset in height relative to the active zones of the second and third layer structures, the layers of the layer arrangement being deposited on the carrier, the active zone being arranged between a p contact and an n contact, an intermediate layer being formed laterally with respect to the first layer structure in the second and third layer structures, the intermediate layer being configured as an electrically blocking layer that hinders or prevents a current flow, and the intermediate layer being arranged between the active zone and the n contact, wherein
   the first layer structure comprises an intermediate layer, the intermediate layer of the first layer structure preventing a current flow, and the intermediate layer of the first layer structure is arranged offset in height relative to the intermediate layers of the second and third layer structures such that an electrically conductive connection is formed laterally between the second and third layer structures and the first layer structure so that an electrically conductive connection is formed between a p contact and an n contact via the active zone of the first layer structure.

11. The method according to claim 10, wherein the intermediate layer is grown epitaxially, and doping is introduced into the intermediate layer during the epitaxial growth.

12. The method according to claim 10, wherein the active zone of the second and third layer structures is arranged at the same height.

13. The method according to claim 10, wherein the active zone of the first layer structure is arranged offset in height by at least one thickness of the active zone with respect to the active zone of the second and/or the third layer structure.

14. The method according to claim 10, further comprising a carrier, the layer arrangement being arranged with the active zone and the waveguide layers on the carrier, the first layer structure being arranged on a web of a substrate.

15. The method according to claim 10, further comprising a carrier, the layer arrangement being arranged with the active zone and the waveguide layers on the carrier, the first layer structure being arranged in a recess of the carrier.

16. The method according to claim 10, wherein the first layer structure comprises at least one first cover layer adjoining the first waveguide layer, the first layer structure comprising at least one second cover layer arranged above the second waveguide layer, the second and third layer structures comprising at least one first cover layer adjoining the first waveguide layer, the second and third layer structures comprising at least one second cover layer arranged above the second waveguide layer.

17. The method according to claim 10, wherein the first layer structure is provided with an electrical p contact, the first layer structure being arranged on a strip-like surface, the strip-like surface comprising a web, an intermediate layer respectively being arranged on the web on both sides along a longitudinal side, the intermediate layer having a low electrical conductivity or no electrical conductivity, the p contact having a wider extent than the web in the X direction.

* * * * *